United States Patent
Ohmi et al.

(10) Patent No.: US 6,255,731 B1
(45) Date of Patent: Jul. 3, 2001

(54) SOI BONDING STRUCTURE

(75) Inventors: Tadahiro Ohmi, 1-17-301, Komegafukuro 2- chome, Aoba-ku, Sendai-shi, Miyagi-ken; Nobuyoshi Tanaka, Tokyo; Takeo Ushiki; Toshikuni Shinohara, both of Sendai; Takahisa Nitta, Fuchu, all of (JP)

(73) Assignees: Canon Kabushiki Kaisha; Tadahiro Ohmi; Ultraclean Technology Research Institute, all of Tokyo (JP)

( * ) Notice: Subject to any disclaimer, the term of this patent is extended or adjusted under 35 U.S.C. 154(b) by 0 days.

(21) Appl. No.: 09/123,364

(22) Filed: Jul. 28, 1998

(30) Foreign Application Priority Data

Jul. 30, 1997 (JP) .................................... 9-204518

(51) Int. Cl.$^7$ .................................................. H01L 23/48
(52) U.S. Cl. .................... 257/758; 257/751; 257/757; 257/759; 257/768; 257/769; 257/772
(58) Field of Search .................... 257/347–355, 257/59–72, 757, 751, 761–766, 758, 759, 768, 769, 772

(56) References Cited

U.S. PATENT DOCUMENTS

| | | | |
|---|---|---|---|
| 5,102,821 | 4/1992 | Moslehi | 437/62 |
| 5,387,555 | 2/1995 | Linn et al. | 437/225 |
| 5,428,250 | * 6/1995 | Ikeda et al. | 257/762 |
| 6,057,212 | * 5/2000 | Chan et al. | 438/455 |

FOREIGN PATENT DOCUMENTS

| | | |
|---|---|---|
| 0 238 066 A2 | 9/1987 | (EP) . |
| 0 256 397 A1 | 2/1988 | (EP) . |
| 0 552 466 A2 | 7/1993 | (EP) . |
| 59-224156 | 12/1984 | (JP) . |
| 4-148525 | 5/1992 | (JP) . |
| 4-186815 | 7/1992 | (JP) . |
| 5-102445 | 4/1993 | (JP) . |
| 5-217820 | 8/1993 | (JP) . |
| 5-217821 | 8/1993 | (JP) . |
| 5-217992 | 8/1993 | (JP) . |
| 5-275329 | 10/1993 | (JP) . |
| 5-275663 | 10/1993 | (JP) . |
| 6-151789 | 5/1994 | (JP) . |
| 6-244416 | 9/1994 | (JP) . |
| 6-342784 | 12/1994 | (JP) . |
| 7-235651 | 9/1995 | (JP) . |
| 7-249749 | 9/1995 | (JP) . |

OTHER PUBLICATIONS

Patent Abstracts of Japan, vol. 018, No. 461 (E–1597), Aug. 26, 1994 & JP 06 151789 A, May 31, 1994.

* cited by examiner

Primary Examiner—Fetsum Abraham
(74) Attorney, Agent, or Firm—Fitzpatrick, Cella, Harper & Scinto

(57) ABSTRACT

A semiconductor substrate adapted to giga-scale integration (GSI) comprises a support, at least the surface of which is made of semiconductor, an electroconductive material layer, an insulating layer and a semiconductor layer arranged sequentially in the above order. The electroconductive material layer has at least in part thereof an electroconductive reacted layer obtained by causing two metals, a metal and a semiconductor, a metal and a metal-semiconductor compound, a semiconductor and a metal-semiconductor compound, or two metal-semiconductor compounds to react each other. An electroconductive reaction terminating layer that is made of a material that does not react with the reacted layer is arranged between the reacted layer and the insulating layer or the support.

58 Claims, 10 Drawing Sheets

P+−Si SUBSTRATE
(DEVICE WAFER)

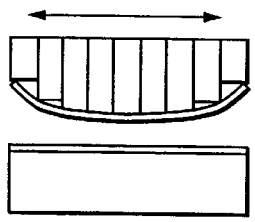
FIG. 5A
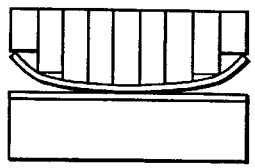
FIG. 5B
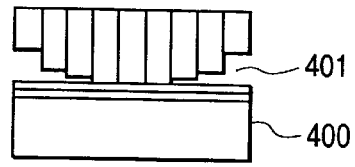
FIG. 5C
FIG. 6
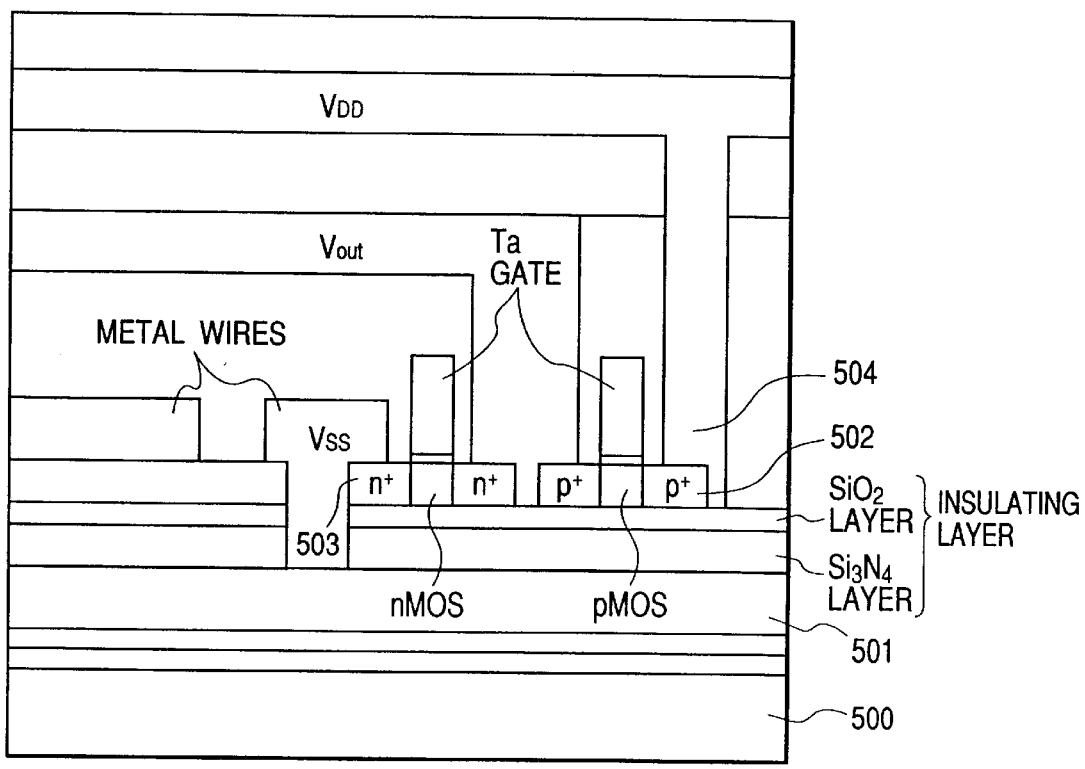

SOI BONDING STRUCTURE

BACKGROUND OF THE INVENTION

1. Field of the Invention

This invention relates to a semiconductor substrate and also to a method of preparing such a semiconductor substrate. More particularly, the present invention relates to a semiconductor substrate having a specific structure of a bonding interface and adapted to an electronic device or an integrated circuit prepared by using a single crystal semiconductor layer arranged on an insulator, as well as a method of preparing such a semiconductor substrate.

2. Related Background Art

MOS transistor integrated circuits take a major part in today's computers and have attained to a remarkably enhanced level of operating performance or operating speed and that of integration for binary digital logic ULSI systems by means of processing techniques adapted to extremely reducing processing dimensions on the basis of the so-called scaling rule. However, as a gate length of less than 1 μm is realized for MOS transistors, representing the available minimum processing dimension, as a result of the dimensional reduction brought about by the development of processing techniques, miniaturized MOS transistors come to be affected by various parasitic effects including the short channel effect that partly annul the improvements in the performance of the transistors due to miniaturization.

A silicon on insulator (SOI) device refers to a device formed in a single crystal silicon semiconductor layer arranged on an insulator and SOI devices have been attracting attention in recent years as they appear very promising for solving the problems attributable to the miniaturization of devices. More recently, SOI is also used to stand for semiconductor-on-insulator. In the initial stages of developing SOIs, efforts were paid to exploit the advantages of SOIs including a reduced parasitic capacity, a high radiation-proof effect and a latch up free effect that cannot be provided by ordinary bulk silicon substrates to be used for ordinary silicon ICs. More often than not, relatively thick silicon layers were used. More recently, however, it has been found that a fully depleted SOI device obtained by depleting its entire silicon thin film layer having a thickness of less than 100 nm can effectively suppress the short channel effect. Fully depleted thin film SOI devices have advantages over conventional bulk devices that can be summarized in four items as listed below.

(1) Easy dielectric separation and full separability of devices make it possible to realize a simplified process and highly integrated devices.
(2) A high radiation-proof effect leads to a high reliability of devices.
(3) A reduced stray capacity allows devices to operate at high speed and low power consumption rate.
(4) A reduced short channel effect and a design rule adapted to miniaturization can be realized because of the feasibility of producing full-depletion layer field effect transistors using a very thin silicon layer.

Generally, an SOI-MOS device is produced by using an SOI wafer as starting material and forming MOS transistors in it. Therefore, the quality of the SOI substrate that is used from the very start of the process of manufacturing an SOI device plays a role that is more important than anything in the subsequent steps of the manufacturing process to make the manufactured SOI device highly reliable and performing. In the past decades, a number of researches have been made to establish methods of preparing an SOI substrate, which may be classified into the following three groups:

(1) those of oxidizing the surface of a silicon single crystal substrate, partly exposing the silicon substrate by opening an window through the oxide film and then forming a silicon single crystal layer on the $SiO_2$ through lateral epitaxial growth by using that part as seed;
(2) those of using the single crystal silicon substrate as active layer and forming a buried $SiO_2$ layer thereunder by means of an appropriately selected technique; and
(3) those of bonding a silicon substrate with an insulating substrate and polishing or etching the silicon substrate to produce a single crystal layer having a desired thickness.

However, methods of any of these groups are accompanied by certain drawbacks. Those of group (1) are not satisfactory in terms of controllability, productivity, uniformity and crystal quality and those of group (2) are also accompanied by the problems of productivity and of crystal quality, whereas those of group (3) are far from perfection from the viewpoint of controllability and uniformity.

Meanwhile, ELTRAN (epitaxial layer transfer by bond & etch back porous Si) SOI substrates have been proposed as high quality SOI substrates comprising an SOI layer that is extending over the entire surface of a substrate with an even thickness and showing an excellent degree of crystallinity along with methods of manufacturing such substrates (see, inter alia, Japanese Patent Application Laid-Open No. 5-102445 "Method of Preparing Semiconductor Substrate", Japanese Patent Application Laid-Open No. 5-217992 "Semiconductor Substrate and Method of Preparing the Same", Japanese Patent Application Laid-Open No. 5-217821 "Method of Preparing Semiconductor Substrate", Japanese Patent Application Laid-Open No. 5-217820 "Semiconductor Substrate and Method of Preparing the Same", Japanese Patent Application Laid-Open No. 5-275663 "Semiconductor Device Substrate and Method of Preparing the Same", Japanese Patent Application Laid-Open No. 5-275329 "Semiconductor Device Substrate and Method of Preparing the Same", Japanese Patent Application Laid-Open No. 6-342784 "Etching Solution for Etching Porous Silicon, Etching Method Using the Same and Method of Preparing Semiconductor Substrate Using the Same", Japanese Patent Application Laid-Open No. 7-249749 "Method of Preparing SOI Substrate" and Japanese Patent Application Laid-Open No. 7-235651 "Semiconductor Substrate and Method of Preparing the Same".) The proposed methods of manufacturing SOI wafers are characterized in that, with any of such methods, it is possible to produce a scarcely defective SOI layer because the pores on the surface of a porous silicon base are closed and sealed as a result of the heat treatment using $H_2$ and conducted prior to the epitaxial growth step and that it is possible to produce an SOI layer that is relatively free from uneven thickness because the etch selectivity of porous silicon relative to an epitaxial layer is as high as $10^5$. Thus, the SOI layer that plays a major role of a semiconductor device is made very smooth and adapted to mass production so that consequently, high quality SOI substrates can be manufactured at low cost.

As for the methods of preparing an SOI substrate by bonding, techniques have been proposed for bonding a layer of a high melting point metal or a high melting point silicide and a layer of another high melting point metal or silicon by utilizing a silicidation reaction on the bonding interface (see, inter alia, Japanese Patent Application Laid-Open No. 6-151789 "Method of Forming Semiconductor Substrate", Japanese Patent Application Laid-Open No. 4-186815 "Method of Manufacturing Silicon-on-Insulator Substrate", Japanese Patent Application Laid-Open No. 4-148525 "SOI Substrate and Method of Manufacturing the Same" and Japanese Patent Application Laid-Open No. 59-224156 "Method of Manufacturing Insulator Separation Substrate"). With any of these methods of manufacturing an SOI wafer, the stress generated by the difference between the thermal expansion of Si and that of $SiO_2$ that has been the problem of the bonding step is reduced to obtain a uniform bonding strength over the entire surface of the substrate by combining a high melting point metal or a high melting point silicide and another high melting point metal or silicon and utilizing a silicidation reaction on the bonding interface.

Additionally, a metal SOI substrate has been proposed as an outcome of the technological development for SOI substrates, where the above last two techniques are combined to produce a large diameter substrate and a device formed on it and adapted to operate at ultra-high speed (Japanese Patent Application Laid-Open No. 8-305356 "Semiconductor Substrate and Method of Preparing the Same"). Thus, it is now possible to realize a cold bonding process by exploiting the high crystal quality, the high controllability, the high productivity and the high uniformity of an SOI substrate achieved by the SOI substrate technology in combination with the above described metal reaction technology. Such an SOI substrate has an excellent insulating structure for producing a barrier layer against electromagnetic waves and realizing an improved heat releasing property and hence it can be used to produce an ultra-high density LSI that operates at ultra-high speed with an operating frequency of 10 GHz. Still additionally, the proposed method of manufacturing an SOI substrate is based on remarkable scientific achievements and adapted to eliminate external turbulences to make it highly functional and productive.

In short, a metal SOI substrate is excellent in that it is based on a novel concept of making the substrate function as a device. Metal SOI substrates are described, inter alia, in Japanese Patent Application Laid-Open No. 6-244416 and U.S. Pat. No. 5,650,650.

However, as a result of a series of experiments preparing specimens of SOI substrate as described above and then various devices in the specimens of SOI substrate for evaluation, the inventor of the present invention came to find that they are none the less accompanied by the following problems. With the structure of the proposed substrate, the metal layer to be used for the bonding/reaction and the metal layer to be used as barrier for protecting the device against electromagnetic waves are made of a same metal. Thus, if the former layer is to be bonded firmly, the bonding process needs to be conducted at high temperature for a prolonged period of time to make the profile of the bonding interface rather flat for the reaction and it is difficult to realize a steep profile. Therefore, it is necessary to produce a layer made of a uniform and stable reaction material for the bonding/ reaction in order to realize a strong bonding effect and eliminate fluctuations on the reacted interface for the subsequent processing steps. However, with the structure of the proposed substrate, unintended reactions can take place on the bonding interface and the change in the volume of the layer due to the reaction gives rise to a change in the stress, which by turn entails the following problems. Firstly, stress is accumulated in the device layer on the insulating film. Secondly, the wafer can become warped by the stress. Thirdly, the layer characterized by the skin depth for barring the passage of electromagnetic waves is reduced. All these phenomena act to degrade the characteristics and the high speed operation of the device comprising the substrate.

SUMMARY OF THE INVENTION

It is therefore an object of the present invention to provide a semiconductor substrate such as a metal SOI wafer that can suppress any degradation in the device characteristics and the high speed operation, while maintaining the barrier effect against electromagnetic waves. In other words, it is an object of the invention to provide a semiconductor substrate adapted to giga-scale integration (GSI). Another object of the invention is to provide a method of preparing such a semiconductor substrate.

According to an aspect of the invention, there is provided a semiconductor substrate comprising an electroconductive material layer formed on a support, an insulating layer formed on the electroconductive material layer and a semiconductor layer formed on the insulating layer, the electroconductive material layer having at least an electroconductive layer selected from:

a reacted layer of metals;

a reacted layer of a metal and a semiconductor;

a reacted layer of a metal and a metal-semiconductor compound;

a reacted layer of a semiconductor and a metal-semiconductor compound; and a reacted layer of metal-semiconductor compounds, wherein a reaction suppressive layer consisting essentially of a material different from that of the electroconductive material layer is arranged between the electroconductive material layer and the insulating layer and/or between the electroconductive material layer and the support.

According to another aspect of the invention, there is provided a method of preparing a semiconductor substrate, comprising steps of:

forming an insulating layer on a first support made of a single crystal semiconductor;

forming a first reaction precursory layer made of a metal, a semiconductor or a metal compound on the insulating layer;

preparing a second support having a second reaction precursory layer made of a metal, a semiconductor or a metal compound; and bringing the first reaction precursory layer and the second reaction precursory layer into contact to react and bond them with each other, wherein the method further comprises a step of forming a reaction suppressive layer made of a material different from any of the materials of the first and second reaction precursory layers between the first reaction precursory layer and the insulating layer and/or between the second reaction precursory layer and the second support.

According to still another aspect of the invention, there is provided a method of preparing a semiconductor substrate, comprising steps of:

preparing a first substrate by forming an insulating layer on the surface of a silicon single crystal substrate body or a silicon single crystal thin film epitaxial layer;

forming a first metal deposited film on the surface of the insulating layer; and forming a second metal deposited film on the surface of the first metal deposited film;

preparing, on the other hand, a second substrate by forming a third metal deposited film on the surface of a silicon single crystal substrate body; and forming a fourth metal deposited film on the surface of the third metal deposited film; and subsequently holding the second metal deposited film on the first substrate and the fourth metal deposited film on the second substrate in close contact relative to each other and heat-treating them to cause an alloying reaction between the second metal deposited film and the fourth metal deposited film.

According to still another aspect of the invention, there is provided a method of preparing a semiconductor substrate, comprising steps of:

preparing a first substrate by
forming an insulating layer on the surface of a silicon single crystal substrate body or a silicon single crystal thin film epitaxial layer;
forming a first metal deposited film on the surface of the insulating layer; and
forming a second metal deposited film on the surface of the first metal deposited film;
preparing, on the other hand, a second substrate by
forming a third metal deposited film on the surface of a silicon single crystal substrate body; and
forming a silicon deposited film on the surface of the third metal deposited film; and
subsequently holding the second metal deposited film on the first substrate and the silicon deposited film on the second substrate in close contact relative to each other and heat-treating them to cause a silicidation reaction between the second metal deposited film and the silicon deposited film.

According to still another aspect of the invention, there is provided a method of preparing a semiconductor substrate, comprising steps of:

preparing a first substrate by
forming an insulating layer on the surface of a silicon single crystal substrate body or a silicon single crystal thin film epitaxial layer;
forming a first metal deposited film on the surface of the insulating layer; and
forming a silicon deposited film on the surface of the first metal deposited film;
preparing, on the other hand, a second substrate by
forming a third metal deposited film on the surface of a silicon single crystal substrate body; and
forming a fourth metal deposited film on the surface of the third metal deposited film; and
subsequently holding the silicon deposited film on the first substrate and the fourth metal deposited film on the second substrate in close contact relative to each other and heat-treating them to cause a silicidation reaction between the silicon deposited film and the fourth metal deposited film.

According to still another aspect of the invention, there is provided a method of preparing a semiconductor substrate characterized by comprising steps of:

preparing a first substrate by
forming an insulating layer on the surface of a silicon single crystal substrate body or a silicon single crystal thin film epitaxial layer;
forming a first metal deposited film on the surface of the insulating layer; and
forming a silicon deposited film on the surface of the first metal deposited film;
preparing, on the other hand, a second substrate by
forming a third metal deposited film on the surface of a silicon single crystal substrate body;
forming a fourth metal deposited film on the surface of the third metal deposited film; and
forming a silicon deposited film on the surface of the fourth metal deposited film; and
subsequently holding the silicon deposited film on the first substrate and the silicon deposited film on the second substrate in close contact relative to each other and heat-treating them to cause the fourth metal deposited film to react with the silicon deposited film on the second substrate and then with the silicon deposited film on the first substrate for silicidation.

BRIEF DESCRIPTION OF THE DRAWINGS

FIGS. 5A, 5B and 5C are schematic cross sectional views of a bonding apparatus that can be used for the purpose of the invention.

FIG. 6 is a schematic cross sectional view of a CMOS device.

DESCRIPTION OF THE PREFERRED EMBODIMENTS

FIGS. 1A through 1I are schematic cross sectional views of an embodiment of semiconductor substrate according to the invention, shown in different preparing steps.

Figure 1A:
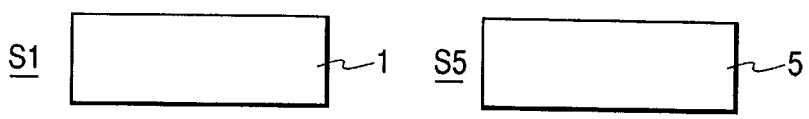
FIGS. 1A, 1B, 1C, 1D, 1E, 1F, 1G, 1H and 1I are schematic cross sectional views of an embodiment of semiconductor substrate according to the invention, shown in different preparing steps.
Figure 1B:
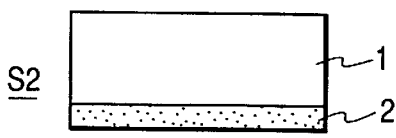
Figure 1F:
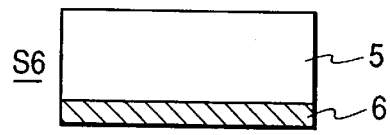
Figure 1D:
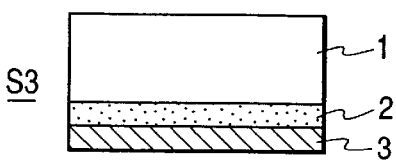
Figure 1G:
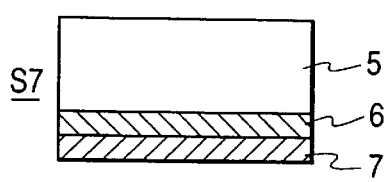
Figures 1C, 1E:
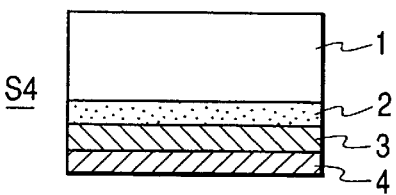
Figure 1H:
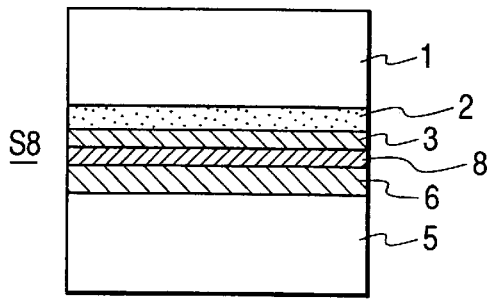
Figure 1I:
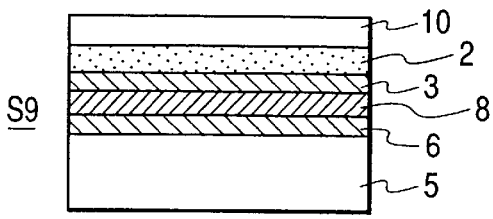

Referring to FIG. 1I, the embodiment of semiconductor substrate S9 comprises a second support 5, an electroconductive material layer 8, an insulating layer 2 and a semiconductor layer 10 sequentially arranged on the second support 5 in the above order.

A reaction suppressive layer (reaction terminating layer or low-reactivity layer) 3, 6 substantially made of an electroconductive material different from that of the electroconductive material layer 8 or a semiconductor material is arranged between the electroconductive material layer 8 and the insulating layer 2 and/or between the electroconductive material layer 8 and the support 5.

With this arrangement, the upper and/or lower interface of the reaction layer 8 can maintain a desired profile and suppress any changes in the interfaces, the storage of stress and the degradation of the device that can occur when the semiconductor layer 10 is processed to form a semiconductor device therein. An active region of FET or bipolar transistor is formed within the semiconductor layer and is connected to the layers 3, 6, 8 via a hole of the insulating layer 2 optionally.

Now, a method of preparing a semiconductor substrate according to the invention will be described.

To begin with, a first support 1 having at least one of its surfaces made of a single crystal semiconductor as shown in FIG. 1A is placed in position (S1).

Then, as shown in FIG. 1B, an insulating layer 2 is formed on the surface of the single crystal semiconductor of the first support 1 (S2).

Then, as shown in FIG. 1C, a first reaction suppressive layer 3 is formed on the surface of the insulating layer 2 (S3).

Subsequently, as shown in FIG. 1D, a first reaction precursory layer 4 is formed on the surface of the reaction suppressive layer 3 (S4).

On the other hand, a second support 5 is placed in position as shown in FIG. 1E (S5) and a second reaction suppressive layer 6 is formed on the surface of the second support 5 as shown in FIG. 1F (S6). Note that either the first reaction suppressive layer 3 or the second reaction suppressive layer 6 may be omitted for the purpose of the invention.

Then, as shown in FIG. 1G, a second reaction precursory layer 7 is formed on the surface of the second reaction suppressive layer 6 (S7).

Subsequently, as shown in FIG. 1H, the first and second reaction precursory layers 4, 7 are brought to contact each other at appropriate temperature. Then, the two layers react with each other for an alloying reaction or a silicidation reaction to produce a reacted layer 8 and consequently the first and second supports 1 and 5 are bonded together.

Note that the first and second reaction suppressive layers are made of a material that does not substantially react with any of the reaction precursory layers 4, 7 and the reacted layer 8 in the alloying reaction or the silicidation reaction during the bonding process. For example, refractory metals or refractory metal compounds whose melting point is 600° C. or higher, can be used for reaction suppressive layers.

Finally, all the unnecessary portions of the first support 1 is removed by appropriate means such as polishing, grinding, etching, cutting and/or peeling except the necessary layer 10.

For the purpose of the invention, the reaction for producing the reacted layer may be a chemical reaction of metal and semiconductor, an alloying reaction of two or more than two metals, a reaction of metal and one or more than one metal-semiconductor compounds, a reaction of semiconductor and one or more than one metal-semiconductor compounds or a reaction of two or more than two metal-semiconductor compounds.

Combinations of metals that can be used for the alloying reaction include Al—Mg, Mg—Zr, Al—Cu, Al—Zn, Al—Mn, Cu—Mg, Cu—Al—Mg, Cu—Al—Mg, Cu—Al—Mg—Ni, Al—Si—Mg, Al—Si—Mg, Cu—Al—Mg—Zn, Fe—Cr—Ni and Fe—Cr—Mo, of which the combinations of Cu—Mg, Cu—Al—Mg and Fe—Cr—Ni are preferable for the purpose of the invention.

Note that, for example, the combination of Al—Mg refers to a total of four reactions including the reaction of Al and Mg, that of an AlMg alloy and Mg, that of Al and an AlMg alloy and that of AlMg alloys with different compositions.

Similarly, the combination of Cu—Al—Mg refers to all alloying reactions that produce a reacted layer of CuAlMg as final product and include the reaction of Cu and an AlMg alloy, that of CuAl and an Mg alloy, that of an CuMg alloy and Al, that of Cu and a CuAlMg alloy, that of Al and a CuAlMg alloy, that of Mg and a CuAlMg alloy, that of a CuAl alloy and a CuMg alloy, that of a CuAl alloy and an AlMg alloy, that of a CuMg alloy and an AlMg alloy and that of CuAlMg alloys with different compositions.

Therefore, for the purpose of the invention, the reaction precursory layer contains at least a metal selected from Al, Mg, Zr, Cu, Zn, Mn, Fe, Cr, Ni and Mo or an alloy containing at least one of the above listed metals.

When metal and semiconductor are selected for the reaction, one or more than one metals selected from Ni, Co, Cr, Fe, Mo, Nb, Pt, Rh, Ta, Ti, V, W and Zr or one or more than one alloys containing any of these metals are used in combination with one or more than one semiconductors selected from amorphous Si, microcrystalline Si, polycrystalline Si, single crystal Si, epitaxial single crystal Si, amorphous Ge, microcrystalline Ge, polycrystalline Ge and single crystal Ge. The combinations of Ni-amorphous Si, Pt-amorphous Si and Ta-amorphous Si are particularly preferable for the purpose of the invention.

When metal and one or more than one metal-semiconductor compounds are selected for the reaction, one or more than one metals selected from Ni, Co, Cr, Fe, Mo, Nb, Pt, Rh, Ta, Ti, V, W and Zr or one or more than one alloys containing any of these metals are used in combination with one or more than one metal-semiconductor compounds having a stoichiometrically imperfect composition such as metal suicides. The combinations of Ni—(NiSi), Ni—(TaSi), Ni—(CoSi), Pt—(NiSi) and Pt—(TiSi) are particularly preferable for the purpose of the invention.

Furthermore, when semiconductor and one or more than one metal-semiconductor compounds are selected for the reaction, one or more than one semiconductors selected from amorphous Si, polycrystalline Si, single crystal Si, epitaxial single crystal Si and Ge in combination with one or more than one metal-semiconductor compounds selected from NiSi, TaSi, CoSi, PtSi and other similar compounds. The combinations of Si—(NiSi), Si—(TaSi), Si—(CoSi), Si—(TiSi) having a stoichiometrically imperfect composition are particularly preferable for the purpose of the invention.

The above described reaction suppressive layer is made of an electroconductive material that does not react with the reacted layer or the material or any of the materials of the reacted layer. The electroconductive material of the reaction terminating layer is selected from metals (including alloys thereof), semiconductors and metal compounds. It may be needless to say that a material that can react with the reacted layer or the material of or any of the materials of the reacted layer may also be used for the reaction terminating layer if such a reaction is negligible during the bonding and subsequent processes from the viewpoint of the temperature range and the duration of the processes.

Metals that can be used for the reaction suppressive layer include Ru, Ir, Ag, Os, Tl, Cu, Bi, Pb, Sn, Mo, In and Zn, of which Ru, Ir, Ag, Cu and Mo are preferable for the purpose of the invention. Ru and Ir are particularly preferable because the oxide of them are electroconductive, which provides a broad process margin.

Semiconductor materials that can be used for the reaction suppressive layer include polycrystalline Si, single crystal Si and epitaxial single crystal Si, of which polycrystalline Si and single crystal Si are particularly preferable for the purpose of the invention.

Metal compounds that can be used for the reaction suppressive layer include TaN, TaSiN, TiN, TiSiN, WN and WSiN, of which TaN, TiN and WN are particularly preferably for the purpose of the invention.

Mo can be used for both the reaction precursory layer and the reaction suppressive layer of a semiconductor substrate according to the invention. Since Mo can produce silicides such as $MoSi_2$ at temperature higher than 525° C., it can effectively be used for the reaction suppressive layer when the bonding step and the subsequent processing steps are conducted at about 450° C. As specific example, if Pt and Si are made to react each other for a silicidation reaction (at about 200° C.), Mo can operate effectively if used for the reaction suppressive layer. Similarly, Mo can also be used for the reaction suppressive layer for a silicidation reaction of producing Mg—Si, Co—Si, Ni—Si or Pd—Si.

Additionally, Si can be used for the reaction suppressive layer when a non-silicidation reaction is used for the bonding operation. For example, Si can be used when an alloying reaction is used for the bonding operation at temperature lower than 400° C.

In short, a material that is less reactive than the material of the reaction precursory layer can be used for the reaction suppressive layer.

For the purpose of the invention, the insulating layer is made of one or more than one materials selected from silicon oxide, silicon nitride, aluminum oxide, aluminum nitride and organic film materials.

For the purpose of the invention, the semiconductor layer where devices are prepared is typically made of non-porous single crystal Si, although the present invention is not limited thereto and semiconductor materials including Ge, diamond and compounds such as GaAs may also be used for the semiconductor layer.

Materials that can be used for the first and second supports include, as well as Si crystal, Ge crystal, sapphire crystal, quartz, glass, metal (crystal) sheet, ceramic sheet and plastic film. The use of an Si wafer having a porous layer is a preferable choice for the first support. A second support of an Si wafer shows an excellent adaptability to various semiconductor manufacturing apparatus and, additionally, reduces the risk of peeling of films.

For the purpose of the invention, the reaction suppressive layer is formed typically by PVD such as sputtering or CVD such as plasma enhanced CVD and has a thickness between 1 nm and 10 $\mu$m, preferably between 10 $\mu$m and 2 $\mu$m. The first reaction suppressive layer has a thickness between 10 nm and 10 $\mu$m, preferably between 0.1 $\mu$m and 2 $\mu$m, whereas the second reaction suppressive layer has a thickness between 1 nm and 10 $\mu$m, preferably between 10 nm and 1 $\mu$m.

For the purpose of the invention, the reaction precursory layer is also formed typically by PVD such as sputtering or CVD such as plasma enhanced CVD and has a thickness between 1 nm and 1 $\mu$m, preferably between 1.5 nm and 200 nm.

The reacted layer has a thickness between 2 nm and 2 $\mu$m, preferably between 3.5 nm and 450 nm.

For the purpose of the invention, all portions of the reaction precursory layer do not necessarily have to become the reacted layer.

A semiconductor substrate according to the invention comprises a base (supporting member), at least the surface of which is semiconductor, an electroconductive material layer, an insulating layer and a semiconductor layer arranged sequentially in the above order.

Both the reacted layer and the reaction suppressive layer may preferably be electroconductive material layers. The reacted layer is typically formed by bonding two substrates that carry on the oppositely disposed surfaces thereof metal layers, a metal layer and a semiconductor layer, a metal and a metal-semiconductor compound or a semiconductor and a metal-semiconductor compound respectively and causing the materials of the layers to react each other. A reaction suppressive layer is formed at least between the reacted layer and the insulating layer and, preferably, a reaction suppressive layer is arranged on the two opposite sides of the reacted layer.

Now, the present invention will be described in terms of preferable embodiments.

A semiconductor substrate according to the invention is adapted to giga-scale integration for realizing an ultra-high density LSI that operates at ultra-high speed with an operating frequency of 10 GHz, which is not realizable with any known SOI substrate. It is practically impossible to realize an ultra-high density LSI that operates at ultra-high speed with an operating frequency of 10 GHz by using a known simple SOI substrate as starting material. In other words, in order for an ultra-high density LSI that operates at ultra-high speed with an operating frequency of 10 GHz to be realized, it is indispensable to solve the problem of the skin effect of signals being transmitted through wires, that of the cross talk and that of the heat generation in operation, which are the problems that have not been any trouble at all until such a high density LSI comes into the scene, in addition to the use of a high quality SOI layer.

Firstly, the skin effect of signals being transmitted through wires will be briefly discussed. In order to realize an LSI that operates at ultra-high speed with an operating frequency of 1 GHz or higher, wires have to be arranged for signal transmission on an insulating layer disposed on a low resistance metal substrate in place of a conventional silicon substrate because, if metal wires are arranged on an insulating layer disposed on a conventional semiconductor substrate, the waveform of the signal being transmitted at high speed is theoretically inevitably attenuated and the waveform will remarkably collapse when the substrate is made of silicon.

This problem can be solved only either by raising the resistivity of the substrate to 100 $\Omega$cm or higher to prevent any electric current from flowing through the substrate or by using a substrate made of a metal having an extremely low resistivity to eliminate any energy loss that can arise when an electric current flows through the substrate. If, however, a silicon substrate having an extremely high resistivity is used, the coupling capacitor relative to adjacent wires will become very large to increase the signal voltage leak between adjacent wires and consequently extremely raise the rate of occurrence of cross talk. Thus, the above identified problem can be solved only by using a metal substrate structure to eliminate the use of a silicon substrate between the wires and the ground from the electric point of view. In order for such a substrate structure to be prevented from having an exposed metal rear surface, the rear surface of the substrate is made to carry a silicon layer as in the case of a conventional substrate and the layer directly held in contact with the insulating layer is made to be a metal layer made of a metal or a silicide having a high electroconductivity and a thickness greater than the skin depth δ of the electromagnetic wave generated when the signal is transmitted through the layer. More specifically, the skin depth of the electromagnetic wave corresponding to the highest frequency component required for a good signal transmission relative to a given device is selected for the smallest film thickness. Additionally, if not metal but silicon is used for the layer directly held in contact with the insulating layer, the silicon layer has to be made sufficiently thinner than the skin depth δ of the tenth harmonic component of the pulse voltage signal being transmitted through the wires and the layer made of an electroconductive material such as metal or silicide and arranged directly under the silicon layer has to be made sufficiently thicker than the skin depth δ of the fundamental component of the pulse voltage signal. While electromagnetic waves are desirably blocked by the uppermost surface layer of an electroconductive material that contacts with the insulating layer, an enhanced degree of design freedom can be allowed by observing the above described structural requirements. Anyway, the problem of attenuation of signals being transmitted through wires that the prior art cannot solve will be dissolved by designing an SOI substrate, taking the skin effect of signals being transmitted through wires into consideration.

The problem of cross talk becomes serious when electronic circuits are arranged at an enhanced level of integration and adjacent wires are located very close to each other. Arranging wires densely to achieve an enhanced level of integration is contradictory to minimizing the cross talk. Therefore, it is desirable to use Cu that is highly migration-resistive and adapted to a large current density as material for the wires and make the wires show a very flat cross section. Additionally, the problem of an enhanced degree of integration and that of cross talk will be solved more easily when a high permittivity thin film made of $Si_3N_4$ or AlN is used for the insulating layer arranged directly under the wires and a low permittivity material such as plastic is used for the insulating film arranged between wires.

While the high permittivity of the insulating layer arranged directly under the wires and used for minimizing the cross talk can increase the load capacity and be detrimental to the high speed operation of the drive transistors, this problem can be dissolved by reducing the gate length of the MOS transistors and/or increasing the permittivity of the gate insulation film to improve the current drive ability. Additionally, the problem of cross talk can also be dissolved by designing a buried insulating layer or the like for the SOI substrate, taking the capacitance between the substrate and the ground into consideration. All in all, the problem of higher degree of integration and that of cross talk as pointed above can be solved by a semiconductor substrate according to the invention.

While densely doped polysilicon is currently used for the gate electrode of a CMOS, the resistance of the wires and the number of steps of manufacturing a CMOS can be dramatically reduced by using a same metal for both the pMOS and the nMOS. However, the respective threshold values $-V_{Th}$ and $V_{Th}$ to be obtained as a result of using a same metal for both the pMOS and the nMOS can be shifted in the same sense in terms of potential to become $-V_{Th}+\Delta V_{Th}$ and $V_{Th}+\Delta V_{Th}$ respectively by the influence of the difference between the work function of silicon and that of the metal of the gate electrode or the electric charge at the interface of the gate electrode and the gate insulating layer and that of the gate insulating layer and the channel region.

The present invention addresses this problem and provides a pair of solutions. Firstly, the problem can be dissolved by burying an electroconductive body having an appropriate work function directly under the insulating film. More specifically, an electroconductive body (n-Si, n$^+$-Si, Ru, Ni, Co, etc.) having a work function smaller than that of non-doped silicon will be used if $\Delta V_{Th}>0$, whereas an electroconductive body (p-Si, p$^+$-Si, Nb, V, Ti, Zn, Al, etc.) having a work function greater than that of non-doped silicon will be used if $\Delta V_{Th}<0$. With this arrangement, the electroconductive body will be biased by way of the insulating film by the built-in potential that is generated between the grounded lower metal layer and the layer of the electroconductive body to cancel the influence of $\Delta V_{Th}$. The reaction suppressive layer may be used for the electroconductive body or an additional electroconductive body may be arranged between the insulating film and the reaction suppressive layer.

Secondly, the problem can be dissolved by using a buried metal layer as power supply line. If $\Delta V_{Th}>0$, the source of the nMOS is connected to the buried metal layer and $-V_{DD}$ ($V_{DD}>0$) is applied to the buried metal layer, while a grounding line is arranged on part of the metal wires and connected to the source of the pMOS. With this power supply arrangement, the electric potential of the silicon of the channel region can be reduced by way of the insulating film to cancel the influence of $\Delta V_{Th}$. If $\Delta V_{Th}<0$ on the other hand, the source of the pMOS is connected to the buried metal layer and $V_{DD}$ ($V_{DD}>0$) is applied to the buried metal layer, while a grounding line is arranged on part of the metal wires and connected to the source of the nMOS. With either of the above solutions, a CMOS circuit having ideal operating characteristics can be realized.

The source of nMOS may preferably be grounded as in Example 2 described below because the buried metal layer should be grounded in case of ultra-high speed operation.

The heat that is generated when the circuit is driven provides the most serious problem for realizing a highly integrated IC that operates at high speed because even a CMOS consumes power and emits heat in proportion to the clock frequency and the heat emitted per unit area will be increased as the degree of integration rises. An ultra-high speed device where a CML (current mode logic) is used more advantageously than a CMOS cannot get rid of the problem of heat emission, either. As a matter of fact, the operational reliability of an ultra-highly integrated circuit is dependent on the temperature rise of the circuit due to the emitted heat. Firstly, the thermal noise level rises as a result of temperature rise to reduce the S/N ratio and give rise to a circuit failure. Secondly, since the service life τ of a set of wires is expressed by the modified Black's equation of $\tau=(E_o/\rho J^2)\times\exp(qE_a/kT)$, service life of the wires is reduced as an exponential function of temperature.

In short, to minimize the temperature rise and to improve the operating speed and the degree of integration are two essential requirements to be met in order to realize a highly performing and highly reliable integrated circuit and these requirements can be satisfied only by selecting materials and a structure for the device that emit heat effectively and efficiently to the outside. To satisfy the requirements, firstly, the monolayer structure of the insulating film of $SiO_2$ (thermal conductivity: 0.015 W/cmK) of the known SOI substrate will have to be replaced by a multilayer structure containing $Si_3N_4$ (thermal conductivity: 9 to 30 W/cmK) and/or AlN (thermal conductivity: 2.5 W/cmK) because $SiO_2$ is a remarkably poor conductor of heat if compared with similar feasible materials. $Si_3N_4$ is an efficient conductor of heat and, unlike $SiO_2$, can operate also as diffusion barrier against metal so that, if it is used in an integrated circuit, it can effectively suppress the diffusion of metal from the handle wafer during the heat treatment process. Therefore, the problem of realizing an ultra-high density LSI that operates at ultra-high speed and that of heat emission that have not been solved by the prior art can now be dissolved by selecting appropriate materials for the SOI substrate, taking the thermal conductivities into consideration.

Generally, it is extremely difficult to firmly bond a metal and a semiconductor, two metals or two semiconductors without leaving any voids on the interface of the two materials because, when bonding two surfaces of such materials that are doped with impurities to an enhanced concentration and or otherwise apt to be oxidized, an oxide film is inevitably produced on the interface to obstruct the intended interfacial reaction. The oxide film leads to the generation of voids and raises the temperature of the heat treatment necessary for the operation of bonding the two surfaces. The high temperature can degrade the quality of the silicon layer.

Thus, in the processing step of bonding a device wafer (prime wafer) and a handle wafer for preparing a high quality SOI substrate, the surfaces of the wafers to be bonded have to be protected by any means against moisture, siloxanes and hydrocarbons that can adhere to the surfaces and also against oxide film that can grow on the surfaces. Two techniques have been proposed to solve this problem. Firstly, both the device wafer and the handle wafer are moved between process chambers in an $N_2$ or $N_2/O_2$ containing atmosphere where the moisture content is minimized (to less than several ppb) so that the film forming operation and the bonding operation may be conducted continuously without the risk of being exposed to the air. This technique is particularly effective when a silicidation reaction is used for the bonding operation because amorphous silicon can be used for the reacting Si layer to reduce the temperature and, at the same time, raise the rate of the bonding reaction.

Secondly, if the device wafer and/or the handle wafer have to be exposed to the air in the clean room during the process of preparing an SOI substrate, non-doped silicon that is less apt to be oxidized is used at least for the surface of one of the wafers, if it is made of silicon. If, on the other hand, the surface is made of metal, a metal such as Pt, Pd or Ni that is hardly oxidized and produces, if oxidized, an oxide film that can be reduced easily by means of $H_2$ is used for the surface. Thus, after forming a film of silicon or metal, the device wafer and the handle wafer that have been exposed to the air in the clean room are brought into the bonding chamber, where they are subjected to a hydrogen radical treatment at 300 to 500° C. in a strongly reducing atmosphere to remove the oxide film and produce highly clean surfaces carrying no natural oxide film before they are bonded together. Table 1 below shows the values of formation free energy ($\Delta G$) of various metal oxides at 25° C. and 500° C., which are standardized temperatures for oxygen.

TABLE 1

| oxide | [kJ/mol $O_2$] | oxide | [kJ/mol $O_2$] | oxide | [kJ/mol $O_2$] |
|---|---|---|---|---|---|
| $Ag_2O$ | 40.6 | $HfO_2$ | −998.5 | $SnO_2$ | −442.8 |
| $Al_2O_3$ | −955.3 | $In_2O_3$ | −452.6 | SrO | −1028.5 |
| BaO | −960.8 | $Li_2O$ | −1005.7 | $Ta_2O_5$ | −678.4 |
| BeO | −1068.5 | MgO | −1036.0 | $Ti_2O_3$ | −1514.3 |
| $Bi_2O_3$ | −243.4 | MnO | −654.6 | $Tl_2O$ | −195.7 |
| CdO | −362.3 | $MoO_2$ | −443.9 | VO | −195.7 |
| CoO | −352.8 | NdO | −675.3 | $WO_2$ | −444.9 |
| $Cr_2O_3$ | −618.6 | $OsO_4$ | −86.8 | $Y_2O_3$ | −1074.2 |
| $Cu_2O$ | −220.8 | PbO | −282.5 | ZnO | −541.1 |
| $Fe_3O_4$ | −425.2 | $Sc_2O_3$ | −1117.9 | $ZrO_2$ | −950.8 |
| $Ga_2O_3$ | −569.0 | $SiO_2$ | −770.1 | | |

The formation free energy of the atmosphere in an equilibrated $H_2+O_2=H_2O$ system is expressed by $\Delta G=\Delta G_{H2O}+ 2RTln(P_{H2}/P_{H2O})$. A metal oxide that is reduced by a hydrogen radical treatment is an oxide having formation free energy at a level higher than that of formation free energy of the atmosphere. More specifically, the oxide film that is carried by the selected metal on the surface should be easily reduced by $H_2$ in the atmosphere and under the conditions of the reducing operation. For example, if the reducing operation is conducted in a system containing impurity moisture by 10 ppb in 100% hydrogen at 500° C. (the formation free energy of the atmosphere: 646.1 kJ/mol $O_2$), metals whose oxides can be reduced in such a system are limited to Ag, Os, Ru, Tl, Cu, Bi, Pb, Ni, Co, Sn, Fe, Mo, W, In, Zn, Ga and Cr. Therefore, the metal material should be selected, taking the surface treatment conditions including the partial pressures of the components of the atmosphere, the processing temperature and the activation energy into consideration.

Additionally, the metals and the metal compounds that are present on the bonding interface and its vicinity preferably have a thermal conductivity as high as that of the upper insulating film from the viewpoint of discharge of heat. Still additionally, in order to avoid accumulation of stress that can be generated by rises and falls of temperature in the high temperature process, the thermal expansion coefficient of the existing substances should be close to that of Si (linear expansion coefficient: $9.6\times10^6 K^{-1}$).

Table 2 below shows the percentage of the reduction in the film thickness (1 −silicide film thickness/sum of the Si film thickness and the metal film thickness prior to the reaction) for various silicides.

TABLE 2

| silicide | percentage of film thickness reduction [%] | silicide | percentage of film thickness reduction [%] |
|---|---|---|---|
| CoSi | 28.32 | RhSi | 22.36 |
| $CoSi_2$ | 24.33 | $TaSi_2$ | 23.22 |
| $CrSi_2$ | 29.71 | $Ti_5Si_3$ | 23.22 |
| $FeSi_2$ | 20.93 | TiSi | 20.16 |
| $MoSi_2$ | 27.22 | $TiSi_2$ | 23.01 |
| $NbSi_2$ | 19.36 | $VSi_2$ | 29.91 |
| $Ni_2Si$ | 20.29 | $WSi_2$ | 22.85 |
| $NiSi_2$ | 23.02 | $ZrSi_2$ | 19.55 |
| PtSi | 14.99 | | |

Since the change in the volume of the device before and after the bonding reaction also can give rise to storable stress, the change in the volume before and after the bonding reaction should be minimized. Additionally, the layer of a metal or a metal compound operating as barrier layer for shutting off electromagnetic waves can be made very thin by selecting a material having a low specific resistance in order to provide an enhanced degree of design freedom for optimizing the film thickness of the layer of a metal or a metal compound in terms of electric conductivity in an attempt to avoid or reduce the stress particularly when the layer is used as power supply or earth (ground) line. According to the invention, it is possible to realize an excellent heat discharging performance by arranging an inactive electromagnetic wave barrier metal layer right under the insulating film. Additionally, due to the presence of an highly extendible metal layer, the stress generated in the upper insulating layer in the thermal processes and the stress generated in the reacted layer in the bonding process can be effectively minimized.

Still additionally, due to the presence of one or more than one reaction suppressive layers, it is possible to use reacting materials that react at very low temperature between 200 and 400° C. and hence the reaction can quickly proceed to the final phase to reduce the overall process time and realize a highly strong and stable bonding effect when such materials are bonded at temperature between 500 and 700° C. For example, Ni is turned into nickel silicide in a temperature range between 200 and 750° C. so that a highly strong and stable bonding effect can be realized in a very short period of time when it is bonded at temperature around 500° C.

Thus, the problem of bonding that the prior art cannot solve will be dissolved by designing an SOI substrate, taking the interface reaction of the materials to be bonded into consideration, to produce a high quality product at low cost.

EXAMPLE 1

Figure 2A:
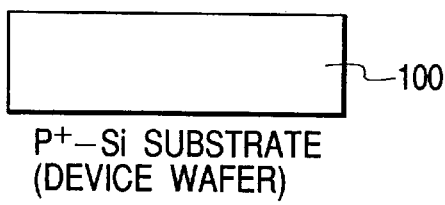
FIGS. 2A, 2B, 2C, 2D, 2E, 2F, 2G, 2H, 2I, 2J, 2K, 2L, 2M, 2N and 2O are schematic cross sectional views of an SOI wafer, shown in different preparing steps.
Figure 2B:

Now, the present invention will be described by way of an example and by referring to FIGS. 2A through 2O of the accompanying drawings. In this example, firstly a 200 $\mu$m thick p-type single crystal silicon substrate 100 having plane (100) to which boron is added to a concentration of $1\times10^{18}$ cm$^{-3}$ is used (FIG. 2A). Then, a porous silicon layer 101 having pores with a diameter of several nanometers to 10 nm and arranged at a pitch of 10 nm to tens of several nanometers is formed on the surface of the substrate to a depth of 10 to 20 $\mu$m by anodizing the surface in an HF/H$_2$O/IPA (20 to 30 wt % HF, 10 to 30 wt % IPA), using a p$^+$-type Si layer as opposite electrode (FIG. 2B). Note that the surface tension of the solution is reduced to closely wet the specimen by adding IPA so that pores with a diameter of several nanometers to 10 nm are formed to a depth of 10 to 20 nm.

Figure 2C:

Subsequently, the specimen is subjected to dry oxidation or steam oxidation at relatively low temperature of 300 to 400° C. to produce a silicon oxide film having a height of 1 to 2 atoms on the walls of the pores of the porous silicon layer (FIG. 2C). Then, the surface of the substrate is subjected to an etching operation, using dilute fluoric acid of 0.1 to 1%. Since dilute fluoric acid show a high surface tension of higher than 70 dyn/cm and the silicon substrate is poorly wettable, dilute fluoric acid would not move into the pores of the porous silicon layer and hence the silicon oxide film on the porous silicon layer would be etched out only at the surface and its vicinity of the layer.

Figure 3:
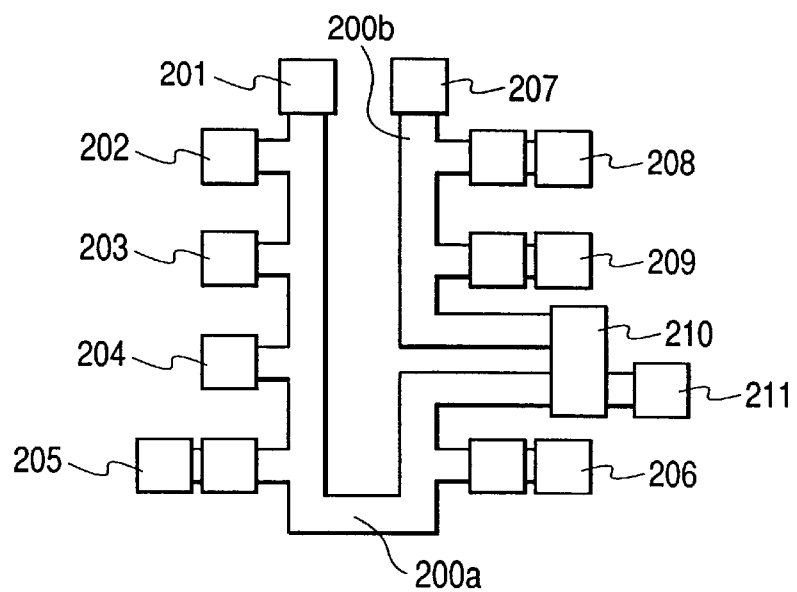
FIG. 3 is a schematic block diagram of a cluster tool, illustrating the basic concept thereof.

The porous silicon layer whose oxide film is removed only at the surface and its vicinity is then loaded on a cluster tool as shown in FIG. 3. The cluster tool of FIG. 3 comprises a device loading chamber 201, a hydrogen surface smoothing unit 202, a low temperature oxidation furnace 203, an epitaxial Si film forming unit 204, an Ru film forming plasma unit 205 and an amorphous Si film forming plasma unit 206 that are connected with each other by way of a low pressure N$_2$/Ar tunnel 200a to produce a device wafer process line. The cluster tool additionally comprises a handle wafer loading chamber 207, an Ru film forming plasma unit 208 and an Ni film forming plasma unit 209 that are connected each other by way of a similar low pressure N$_2$/Ar tunnel 200b to produce a handle wafer process line. Then, the device wafer process line and the handle wafer process line are put together at a bonding unit 210 and connected further to an unloading chamber 211. With the process of this example, all the subsequent processing steps including the film forming step, the heat treatment step and the bonding step are conducted in this cluster tool. The above described cluster tool is characterized in that all the process chambers are connected by N$_2$/Ar tunnels so that the semiconductors, the metals and the insulators on the substrate are not exposed to the atmosphere at all and the film forming operations can be conducted continuously in a clean atmosphere.

Figure 2D:

After the loading step, the specimen is subjected to a heat treatment operation conducted at 1,000 to 1,100° C. in a hydrogen atmosphere to produce a flat and smooth non-porous single crystal silicon layer on the surface that contains the porous silicon layer in the inside (FIG. 2D). The flatness and the smoothness of the non-porous single crystal silicon layer of the surface will be improved when the H$_2$ atmosphere is made to contain SiH$_2$Cl$_2$ or SiHCl$_3$ by about 1 to 100 ppm.

Figure 2E:
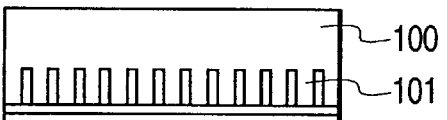

Thereafter, a single crystal silicon layer 102 is made to grow to show a thickness of about 0.5 to 2 $\mu$m on the porous silicon layer 101 whose outermost surface has been turned to non-porous, using SiH$_2$Cl$_2$ at 100 to 1,100° C. or SiH$_4$ gas at 900 to 1,000° C. (FIG. 2E). The growth temperature can be lowered to about 800 to 850° C. if the growth process is conducted under low pressure of about 10 Torr.

Figure 2F:
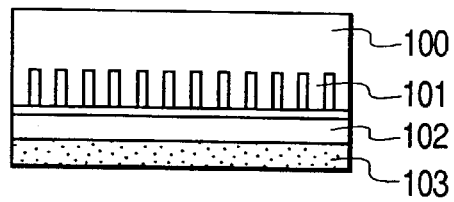

Subsequently, an oxide film 103 is formed to a thickness of about 5 nm to 1 $\mu$m on the surface of the epitaxially grown silicon layer through steam oxidation of the silicon (FIG. 2F). This oxidation process is conducted at 300 to 400° C. in a reactor that is coated with Pt/TiN in an atmosphere of H$_2$+H$_2$O produced by introducing a mixture gas of 2H$_2$+($\frac{1}{2}$)O$_2$ and causing the oxygen to react and become completely consumed.

Figure 2G:
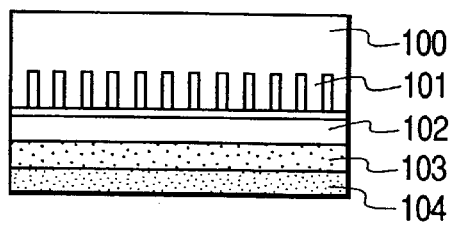
Figure 2H:
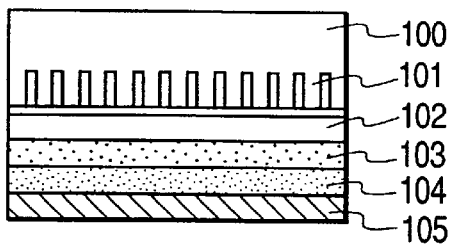
Figure 2I:
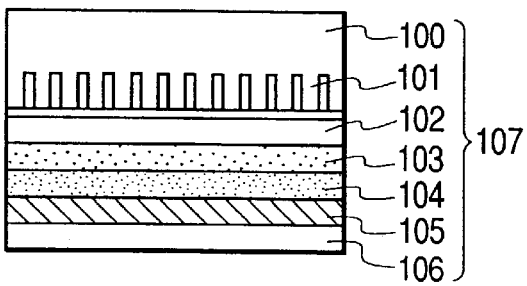

Then, a silicon nitride insulating film 104 is formed thereon to a thickness of about 0.02 to 1.5 $\mu$m by means of plasma CVD (FIG. 2G) and then consecutively an Ru thin film 105 is formed thereon to a thickness of about 0.1 to 2 $\mu$m by sputtering in a bifrequency excitation plasma system (FIG. 2H). Thereafter, an amorphous silicon layer 106 showing a resistivity of about 0.01 to 10 k$\Omega$cm and containing an impurity to a very low concentration ($1\times10^{12}$ to $1\times10^{15}$ cm$^{-3}$) is formed further thereon to a thickness of about 2 to 200 nm by deposition in the same bifrequency excitation plasma system (FIG. 2I). The obtained substrate is used as device wafer 107 or a first support.

Figure 4:
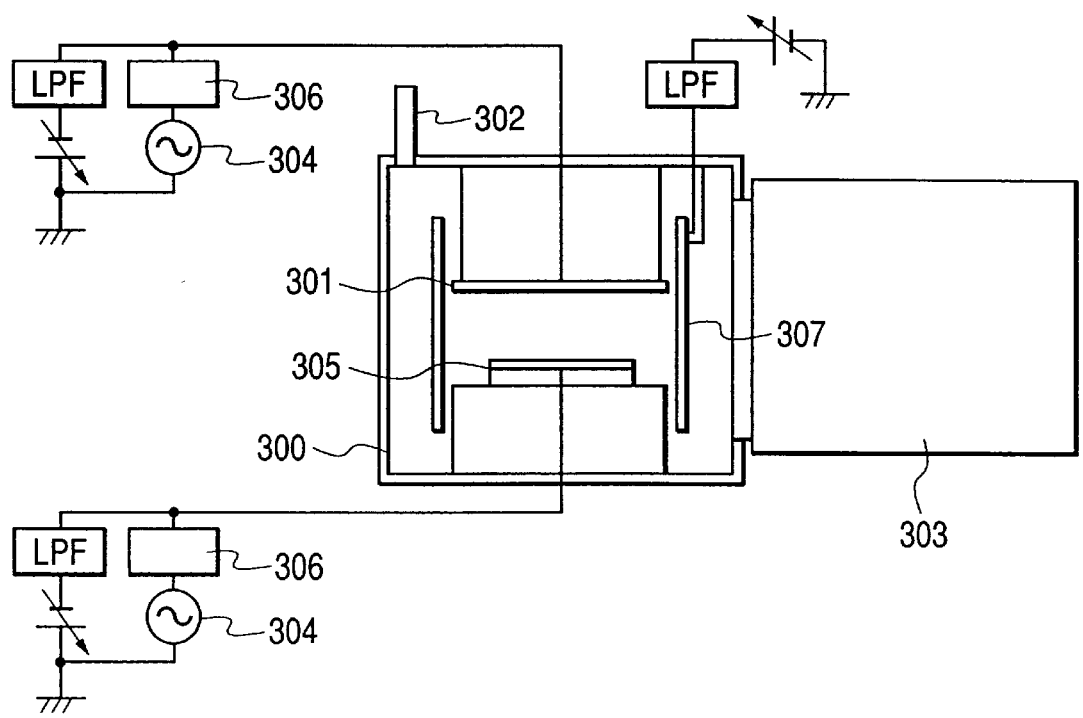
FIG. 4 is a schematic block diagram of a bifrequency excitation plasma system, illustrating the basic concept thereof.

FIG. 4 is a schematic block diagram of a bifrequency excitation plasma system that can be used for the purpose of the invention. The system comprises a chamber 300 for containing in the inside a target 301 and a specimen holding section arranged in parallel with each other and is provided with a gas inlet port 302 and an evacuation system 303. An RF power source 304 is connected to both the target 301 and the specimen 305 by way of respective matching circuits 306 so that the bias of the specimen 305 can be controlled when an insulating film of SiO$_2$ is deposited or when a layer is deposited on the insulator substrate. A shield 307 is arranged to enclose the electrodes in such a way that the potential of the shield 307 can be controlled by applying a bias voltage from outside. The evacuation system 303 comprises an oil-free magnetic levitation type turbo molecular pump and a dry pump to provide ultra-vacuum of about $10^{10}$ Torr in the chamber 300. Ultra-high purity gas is introduced into the chamber 300 by way of the gas inlet port 302.

It will be appreciated that a high quality Ru thin film or a high quality amorphous silicon thin film can be formed to a desired thickness on an insulating material such as silicon nitride with the above described system under appropriate conditions.

Similarly, a high quality thin film deposit can be obtained by means of a multipolar excitation system comprising a dipole ring magnet (DRM) having an evenly distributed magnetic field. Such a film deposit is highly uniform and adapted to be extended over a large area. Likewise, highly uniform high density plasma of about $10^{12}$ cm$^{-3}$ with low plasma irradiation energy can be generated to produce a high quality thin film deposit by means of a radial line slot antenna (RLSA) excitation system that uses a microwave with a frequency of about 2 to 20 GHz.

Figure 2J:
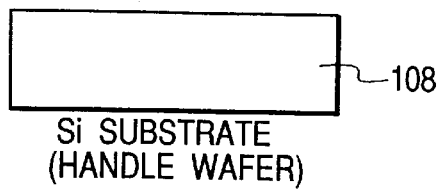
Figure 2K:
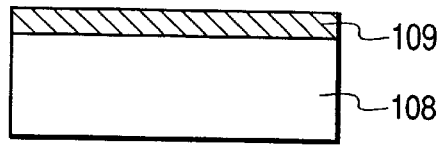
Figure 2L:
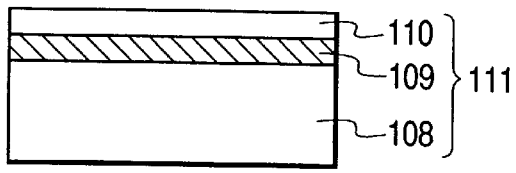

Thereafter, another Si substrate 108 that is different from the p+-type single crystal silicon substrate 100 is placed in position (FIG. 2J) and an Ru thin film 109 (FIG. 2K) and an Ni thin film 110 (FIG. 2L) are sequentially formed to respective thicknesses of about 0.01 to 1 μm and about 1.5 to 150 nm to produce a handle wafer 111 as a second support.

Then, the amorphous silicon layer 106 of the device wafer 107 and the Ni layer 110 of the handle wafer 111 are put together and held in firm contact with each other to produce a bonding interface, which is then subjected to a heat treatment.

FIGS. 5A through 5C are schematic cross sectional view of a bonding apparatus that can be used for bonding the device wafer 107 and the handle wafer 111. Note that FIGS. 5A through 5C respectively show the processing steps of setting a pair of wafers in position, bringing central areas of the wafers into close contact with each other and terminating the bonding operation. A completely flat stage 400 and a ring-shaped multi-step electrostatic chuck 401 are held to 200 to 400° C. to remove any moisture and hydrocarbon compounds that may be adhering to the surfaces thereof. It may be needless to say that the surface of the device wafer 105 and that of the handle wafer 106 transported from an upstream chamber of the cluster tool are totally free from moisture, hydrocarbons and siloxanes. Firstly the wafers are pressed against each other at respective central areas in an ultra-clean low pressure atmosphere of $1 \times 10^{-5}$ to 10 Torr containing Ar and/or $N_2$. More specifically, the handle wafer 111 is held by an electrostatic chuck 401 and warped along the profile of the electrostatic chuck 401 before the wafers are aligned by driving the stage section 400. Then, the wafers are bonded to each other gradually from the center toward the periphery as a gradient vacuuming voltage that is gradually reduced from the center toward the periphery is used for the ring-shaped multi-step electrostatic chuck. Note that low temperature is used for this bonding operation in order to prevent any silicidation reaction from taking place.

It should be stressed once again that the above described cluster tool was used in this example of forming an SOI substrate base by bonding a device wafer 107 and a handle wafer 111 in order to realize a stable ultra-clean bonding interface that is free from any oxide film. Therefore, the silicon surface of the device wafer 107 and the metal surface of the handle wafer 111 that provide the bonding interface are totally free from moisture, siloxanes and hydrocarbons. Additionally, in order to avoid any growth of oxide film on the metal surface, the device wafer 107 is not exposed to the atmosphere after forming the amorphous silicon film 106, while the handle wafer 111 is not exposed to the atmosphere after forming the Ni layer 110 so that they are transported in an $N_2$ or $N_2/O_2$ atmosphere and bonded together in consecutive steps, keeping the surfaces in an ultra-clean condition, to make the bonded interface totally free from natural oxide film.

Figure 2M:
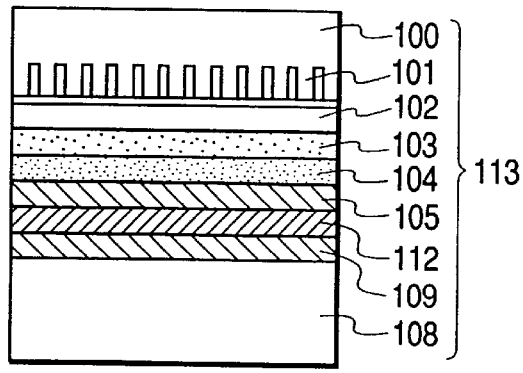

The above heat treatment is conducted in an Ar atmosphere at processing temperature of 500° C. for a duration of about an hour, using processing gas. At the end of the heat treatment, all the amorphous silicon 106 is turned into a silicide layer 112 to firmly bond the two wafers and produce a single bonded wafer 113 as a result of the silicidation reaction (FIG. 2M).

Figure 2N:
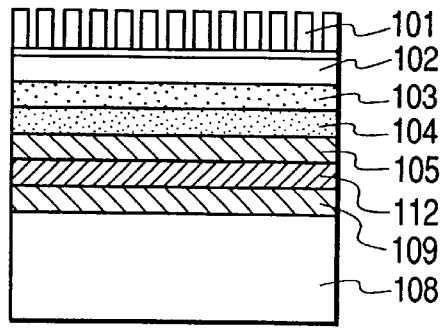
Figure 2O:
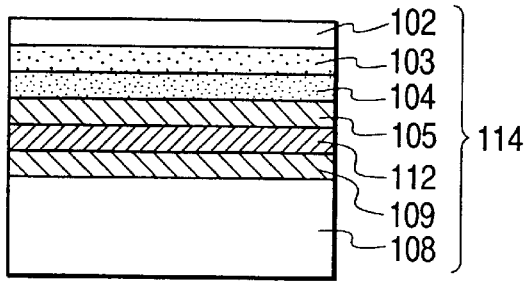

Subsequently, the p+-type substrate 100 on the side of the device wafer is ground to nearly get to the porous layer 101 by means of a grinder (FIG. 2N) and the bonded base 113 is immersed in a selective etching solution, which may be a solution of $HF/HNO_3/CH_3COOH/H_2O$, to selectively etch the porous portion (porous silicon base) 101 and the surface of the base is smoothed typically by means of PACE (plasma assisted chemical etching) to produce a finished SOI substrate 114 (FIG. 2O).

When the depth profile of the obtained SOI substrate was observed by means of SIMS in the example, it was found that the bonding/reaction interface had a steep profile that cannot be realized on the bonding/reaction interface of any known metal substrate SOI wafer and each of the functional layers (the electromagnetic wave barrier layer and the bonded/reacted layer) could be controlled for the thickness. Thus, it was confirmed that a large diameter wafer such as a 300 mm wafer shows a warp only comparable with that of the starting wafer after passing through the heat treatment steps equivalent to those of a CMOS manufacturing process and no peeled films were observed.

Then, MOS transistors were formed on the metal substrate SOI wafer as shown in FIG. 6. Firstly, an $SiO_2$ insulating film was formed and a 0.5 μm thick Ta layer was formed. Thereafter, the gate electrodes and the source/drain electrodes were patterned and the source/drain layer was formed by ion implantation. Note that, in this example, the Ta gate was used as mask in the process of forming the source/drain regions by ion implantation in a self aligning fashion. The layer implanted with ions was annealed at low temperature of 450° C. The ion implantation system used in this example was an ultra-clean ion implantation system designed to produce vacuum of a degree of $10^{-10}$ Torr and sufficiently minimize the contamination due to the sputtering of the metals of the chamber vessel caused by ion beams. A CMOS type inverter circuit was prepared and the source 503 of the n-type MOS transistor was connected to the Ru layer 501 located right thereunder while the source 502 of the p-type MOS transistor was connected to the Cu wire 504 located right thereon. The Ru substrate 501 was grounded and the Cu wire 504 was connected to the power supply voltage. The Cu wire 504 was made to have an area equal to ⅔ of that of the chip.

Figure 7A:
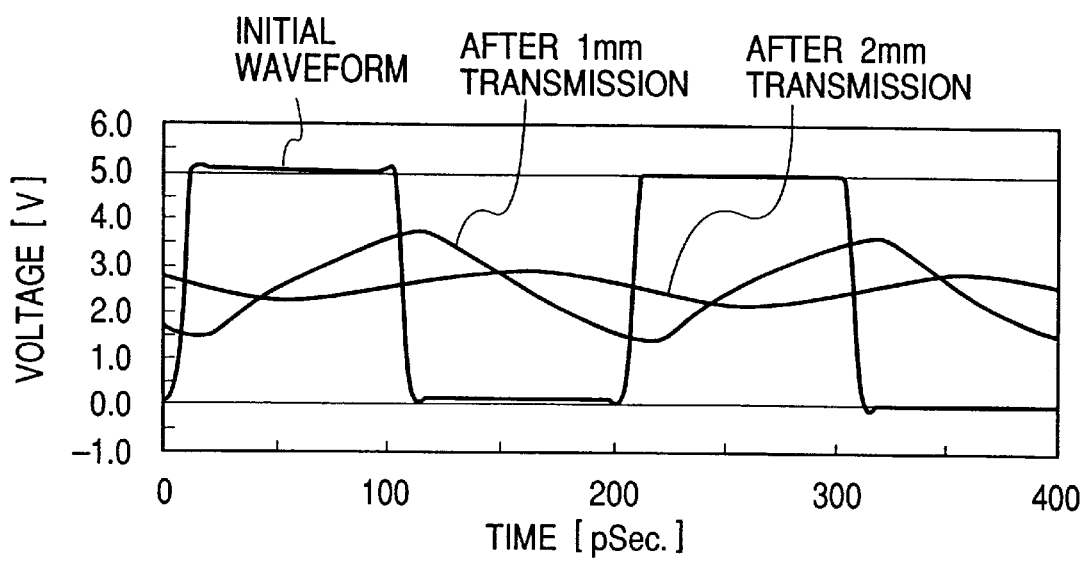
FIGS. 7A and 7B are graphs showing the waveforms of a 0.1 nsec pulse signal being transmitted on a silicon substrate and through an Al wire on a metal SOI substrate respectively by 1 mm and 2 mm.
Figure 7B:
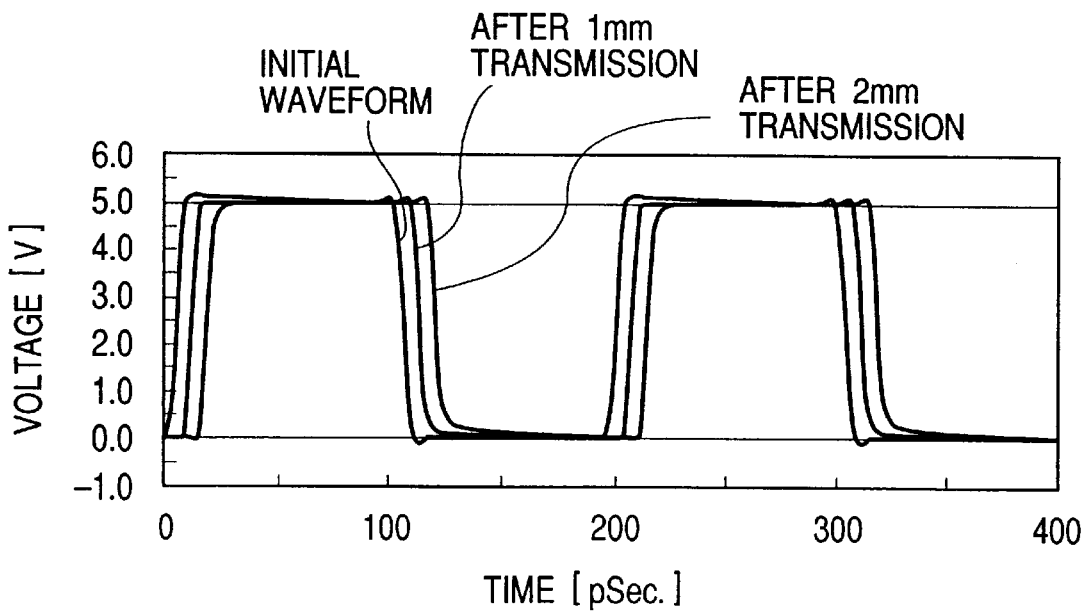
Figure 8:
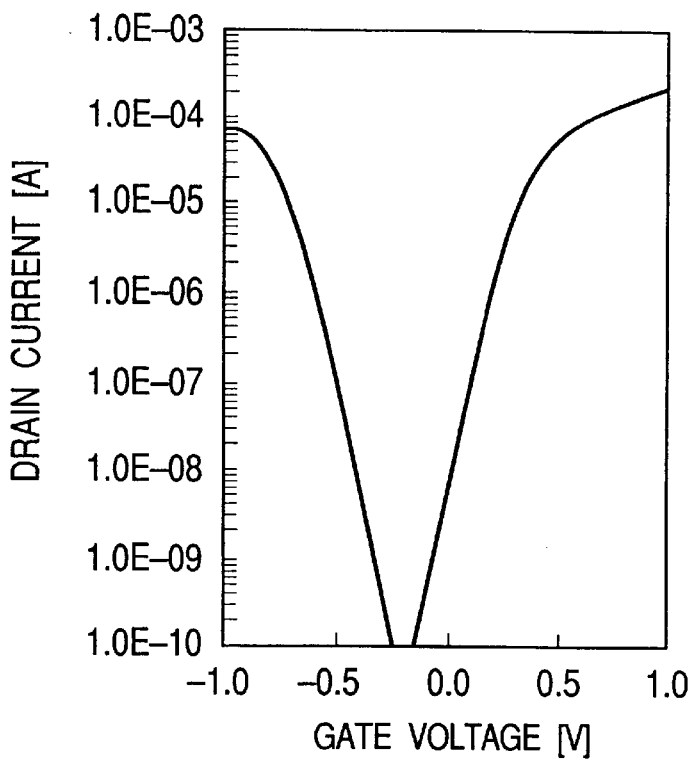
FIG. 8 is a graph showing the sub-threshold characteristic of a pMOS and that of an nMOS.
Figure 9:
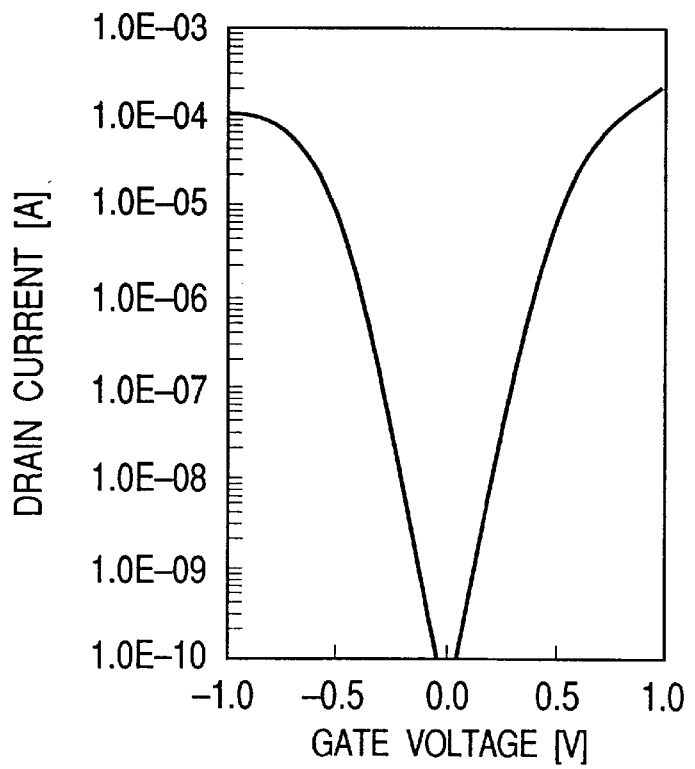
FIG. 9 is a graph showing the sub-threshold characteristic of a power inversion type pMOS and that of a power inversion type NMOS.

FIGS. 7A and 7B are graphs showing how the waveform of a pulse signal is deformed when transmitted at room temperature through a wire arranged on a silicon substrate with an insulating film interposed therebetween. More specifically, the deformed signal waveform that appears on a silicon substrate as shown in FIG. 7A is not observable when the signal is transmitted through a wire arranged on a metal substrate as shown in FIG. 7B. This means that, when a metal wire is arranged on a metal substrate with an insulating film interposed therebetween, the electric field that arises there does not have any component directed along the direction of signal transmission and the only component of the electric field is directed perpendicularly relative to the direction of the signal transmission so that the signal is left free from attenuation due to the electric field. FIG. 8 shows a graph of the sub-threshold characteristic of an n-type MOS and a p-type MOS. From these graphs, it will be seen that there arises a voltage shift of $\Delta V_{Th}$=−0.2V that interferes with the proper operation of a CMOS inverter. Then, there was prepared a device by way of a process exactly same as that of preparing the above inverter, wherein the source of the p-type MOS was connected to the buried metal layer and 1V was applied to the buried metal layer to use the buried metal layer as power supply line. FIG. 9 shows a graph illustrating the sub-threshold characteristic of the device. It will be appreciated that $\Delta V_{Th}$ is canceled by this arrangement of the power source. Thus, a CMOS inverter adapted to changes in $\Delta V_{Th}$ is realized by using an SOI wafer according to the invention.

Figure 10:
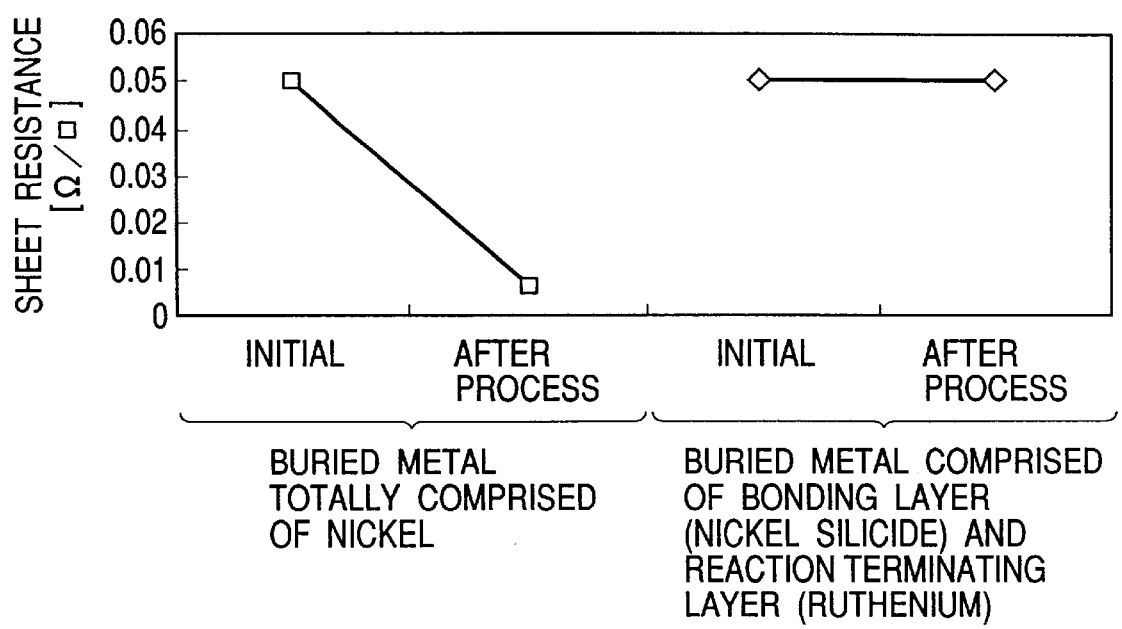
FIG. 10 is a graph showing the sheet resistance of a buried metal layer.

FIG. 10 shows a graph illustrating the sheet resistance of the buried metal layer that was exposed by etching the wafer after the completion of the process. For the purpose of comparison, FIG. 10 also shows the sheet resistance of a buried metal layer obtained by totally replacing the Ru by Ni. While sheet resistance of the specimen of this example did not show any change between immediately after the bonding operation and after the completion of the process (the line at the right side), that of the modified specimen showed a remarkable change (the line at the left side). By computation, it was found that about 48% of the Ni existed immediately after the bonding operation had been silicidized in the course of the various subsequent processing steps so that the thickness of the buried metal layer optimized relative to the skin depth had been changed to lose, if partly, the barrier effect against electromagnetic fields. Thus, it was proved that a metal substrate SOI device showing a wide process margin can be prepared according to the invention.

While silicon was used for the flat and plain semiconductor layer in the above example, any other semiconductor such as Ge, diamond or GaAs may be used to realize the same effect.

While Ru is used for the reaction terminating layer in the above example, it may be replaced by another high melting point metal, an alloy containing a high melting point metal, a semiconductor or a compound thereof to realize the same effect if the above processing steps are observed.

While a reaction between a metal such as nickel and silicon, that is a silicidation reaction, was used for bonding, other reactions including metal alloying reaction may be used to realize the some effect.

While nickel silicide was used as the silicide of the above example, silicide of some other metal may be used to realize the same effect.

While the deposited silicon film formed on the surface of the device wafer was brought into close contact with the surface metal layer of the handle wafer and heated in the process of bonding the device wafer and the handle wafer in the above example, a deposited metal film formed on the surface of the device wafer may be brought into close contact with the silicon surface of the handle wafer and heated in the bonding process to realize an effect same as that of the above example.

While the heat treatment was conducted in an Ar atmosphere after the bonding operation in the above example, the Ar gas may be replaced by an inert gas such as $N_2$ gas or He gas to realize the same effect. While the device wafer was removed by grinding in the above example, it may alternatively be removed by means of a process for peeling the substrate through the porous silicon layer or its vicinity to realize the same effect.

While the technique of PACE was used for the smoothing operation after etching the porous silicon layer in the above example, any other appropriate smoothing technique may alternatively be used to realize the same effect.

While $\Delta V_{Th}$ was corrected by modifying the configuration of the power source in the above example, the same effect may be realized by performing a correcting operation by alternatively burying an electroconductive layer having a different work function.

EXAMPLE 2

Figure 11A:
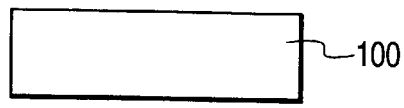
FIGS. 11A, 11B, 11C, 11D, 11E, 11F, 11G, 11H, 11I, 11J, 11K, 11L and 11M are schematic cross sectional views of another embodiment of SOI wafer, shown in different preparing steps.
Figure 11B:
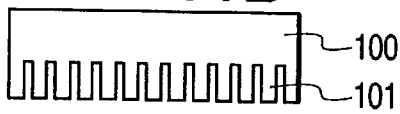

Now, the present invention will be described by way of an example and by referring to FIGS. 11A through 11M of the accompanying drawings. In this example, firstly a 200 μm thick p-type single crystal silicon substrate 100 having plane (100) to which boron is added to a concentration of $1 \times 10^{18}$ cm$^{-3}$ is used (FIG. 11A). Then, a porous silicon layer 101 having pores with a diameter of several nanometers to 10 nm and arranged at a pitch of 10 nm to tens of several nanometers is formed on the surface of the substrate to a depth of 10 to 20 μm by anodizing the surface in an HF/H$_2$O/IPA (20 to 30 wt % HF, 10 to 30 wt % IPA), using a p$^+$-type Si layer as opposite electrode (FIG. 11B). Note that the surface tension of the solution is reduced to closely wet the specimen by adding IPA so that pores with a diameter of several nanometers to 10 nm are formed to a depth of 10 to 20 nm.

Figure 11C:
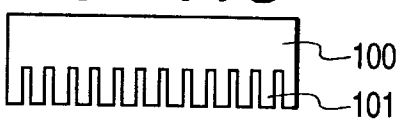

Subsequently, the specimen is subjected to dry oxidation or steam oxidation at relatively low temperature of 300 to 400° C. to produce a silicon oxide film having a height of 1 to 2 atoms on the walls of the pores of the porous silicon layer (FIG. 11C). Then, the surface of the substrate is subjected to an etching operation, using dilute fluoric acid of 0.1 to 1%. Since dilute fluoric acid show a high surface tension of higher than 70 dyn/cm and the silicon substrate is poorly wettable, dilute fluoric acid would not move into the pores of the porous silicon layer and hence the silicon oxide film on the porous silicon layer would be etched out only at the surface and its vicinity of the layer.

The porous silicon layer whose oxide film is removed only at the surface and its vicinity is then loaded on a cluster tool. With the process of this example, the semiconductors, the metals and the insulators on the substrate are not exposed to the atmosphere at all and the film forming operations can be conducted continuously in a clean atmosphere.

Figure 11D:
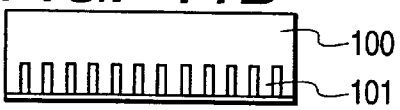

After the loading step, the specimen is subjected to a heat treatment operation conducted at 1,000 to 1,100° C. in a hydrogen atmosphere to produce a flat and smooth non-porous single crystal silicon layer on the surface that contains the porous silicon layer in the inside (FIG. 11D). The flatness and the smoothness of the non-porous single crystal silicon layer of the surface will be improved when the H$_2$ atmosphere is made to contain SiH$_2$Cl$_2$ or SiHCl$_3$ by about 1 to 100 ppm.

Figure 11E:
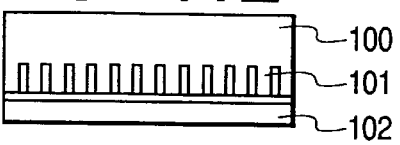

Thereafter, a single crystal silicon layer 102 is made to grow to show a thickness of about 0.5 to 2 μm on the porous silicon layer 101 whose outermost surface has been turned to non-porous, using SiH$_2$Cl$_2$ at 1,000 to 1,100° C. or SiH$_4$ gas at 900 to 1,000° C. (FIG. 11E). The growth temperature can be lowered to about 800 to 850° C. if the growth process is conducted under low pressure of about 10 Torr.

Figure 11F:
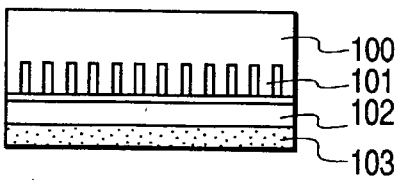
Figure 11G:
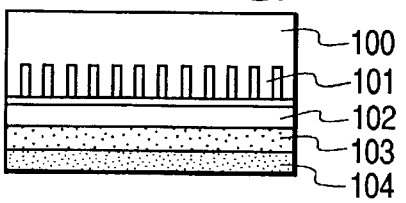

Subsequently, an oxide film 103 is formed to a thickness of about 5 nm to 1 μm on the surface of the epitaxially grown silicon layer through steam oxidation of the silicon (FIG. 11F). This oxidation process is conducted at 300 to 400° C. in a reactor that is coated with Pt/TiN in an atmosphere of H$_2$+H$_2$O produced by introducing a mixture gas of 2H$_2$+ (½)O$_2$ and causing the oxygen to react and become completely consumed.

Figure 11H:
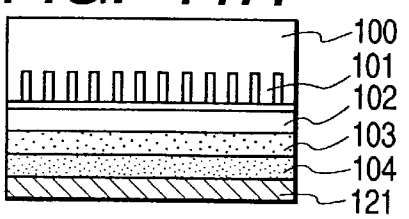
Figure 11I:
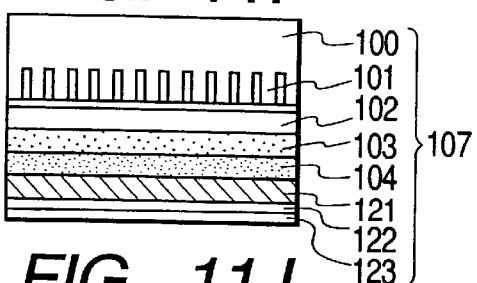
Figure 11J:
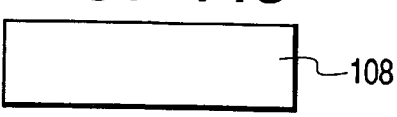

Then, a silicon nitride insulating film 104 is formed thereon to a thickness of about 0.02 to 1.5 μm by means of plasma CVD (FIG. 11G) and then consecutively a boron-doped p$^+$-type Si layer 121 is formed thereon to a thickness of about 1 to 500 nm by plasma CVD (FIG. 11H). Thereafter, an Ir thin film 122 and a Ni thin film 123 are formed further thereon to a thickness each of about 0.2 to 2 μm by plasma CVD (FIG. 11I). The obtained substrate is used as device wafer 107 as a first support.

A high quality Ir or Ni thin film deposit can be obtained by means of a multipolar excitation system comprising a dipole ring magnet (DRM) having an evenly distributed magnetic field. Such a film deposit is highly uniform and adapted to be extended over a large area. Likewise, highly uniform high density plasma of about $10^{12}$ cm$^{-3}$ with low plasma irradiation energy can be generated to produce a high quality oxide, nitride or silicon thin film by means of a radial line slot antenna (RLSA) excitation system that uses a microwave with a frequency of about 2 to 20 GHz.

Thereafter, another Si substrate 108 that is different from the p$^+$-type single crystal silicon substrate 100 is placed in position (FIG. 11J) and is subjected to chemical cleansing by the use of HF or the like to remove natural oxide film and effect hydrogen termination of the surface, thereby obtaining a handle wafer 111 as a second support.

Then, the Ni layer 123 of the device wafer 107 and the surface of the handle wafer 108 are put together and held in firm contact with each other to produce a bonding interface, which is then subjected to a heat treatment.

FIGS. 5A through 5C are schematic cross sectional views of a bonding apparatus that can be used for bonding the device wafer 107 and the handle wafer 108. Note that FIGS. 5A through 5C respectively show the processing steps of setting a pair of wafers in position, bringing central areas of the wafers into close contact with each other and terminating the bonding operation. A completely flat stage 400 and a ring-shaped multi-step electrostatic chuck 401 are held to 200 to 400° C. to remove any moisture and hydrocarbon compounds that may be adhering to the surfaces thereof. It may be needless to say that the surface of the device wafer 105 and that of the handle wafer 108 transported from an upstream chamber of the cluster tool are totally free from moisture, hydrocarbons and siloxanes. Firstly the wafers are pressed against each other at respective central areas in an ultra-clean low pressure atmosphere of $1 \times 10^{-5}$ to 10 Torr containing Ar and/or N$_2$. More specifically, the handle wafer 108 is held by an electrostatic chuck 401 and warped along the profile of the electrostatic chuck 401 before the wafers are aligned by driving the stage section 400. Then, the wafers are bonded to each other gradually from the center toward the periphery as a gradient vacuuming voltage that is gradually reduced from the center toward the periphery is used for the ring-shaped multi-step electrostatic chuck. Note that low temperature is used for this bonding operation in order to prevent any silicidation reaction from taking place.

It should be stressed once again that the above described cluster tool was used in this example of forming an SOI substrate base by bonding a device wafer 107 and a handle wafer 108 in order to realize a stable ultra-clean bonding interface that is free from any oxide film. Therefore, the metal surface of the device wafer 107 and the silicon surface of the handle wafer 108 that provide the bonding interface are totally free from moisture, siloxanes and hydrocarbons. Additionally, in order to avoid any growth of oxide film on the metal surface, the device wafer 107 is not exposed to the atmosphere after forming the Ni layer 123, while the handle wafer 108 is not exposed to the atmosphere after hydrogen termination treatment so that they are transported and bonded together in consecutive steps, keeping the surfaces in an ultra-clean condition, to make the bonded interface totally free from natural oxide film.

Figure 11K:
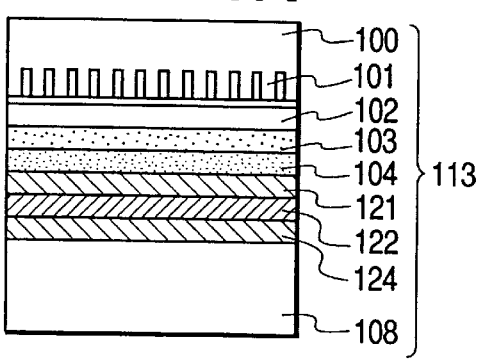
Figure 11L:
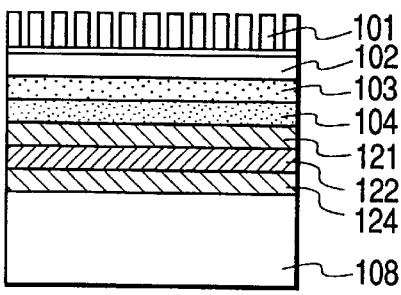

The above heat treatment is conducted in an Ar atmosphere at processing temperature of 500° C. for a duration of about an hour, using processing gas. At the end of the heat treatment, all the Ni layer 123 is turned into a nickel silicide layer 124 of 10 nm in thickness to firmly bond the two wafers and produce a single bonded wafer 113 as a result of the silicidation reaction (FIG. 11K).

Figure 11M:
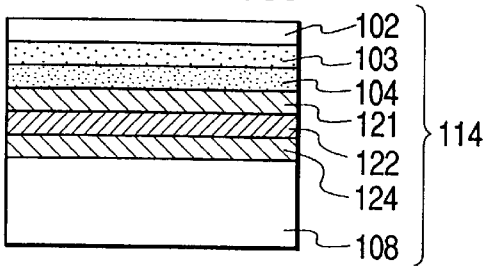

Subsequently, the p$^+$-type substrate 100 on the side of the device wafer is removed (FIG. 11L) and the bonded base 113 is immersed in a selective etching solution, which may be a solution of HF/HNO$_3$/CH$_3$COOH/H$_2$O, to selectively etch the remaining portion of porous silicon 101 and the surface of the base is smoothed typically by heat treatment in a hydrogen atmosphere at 900° C. or higher to produce a finished SOI substrate 114 (FIG. 11M).

When the depth profile of the obtained SOI substrate was observed by means of SIMS in the example, it was found that the bonding/reaction interface had a steep profile that cannot be realized on the bonding/reaction interface of any known metal substrate SOI wafer and each of the functional layers (the electromagnetic wave barrier layer and the bonded/reacted layer) could be controlled for the thickness. Thus, it was confirmed that a large diameter wafer such as a 300 mm wafer shows a warp only comparable with that of the starting wafer after passing through the heat treatment steps equivalent to those of a CMOS manufacturing process and no peeled films were observed.

Figure 12:
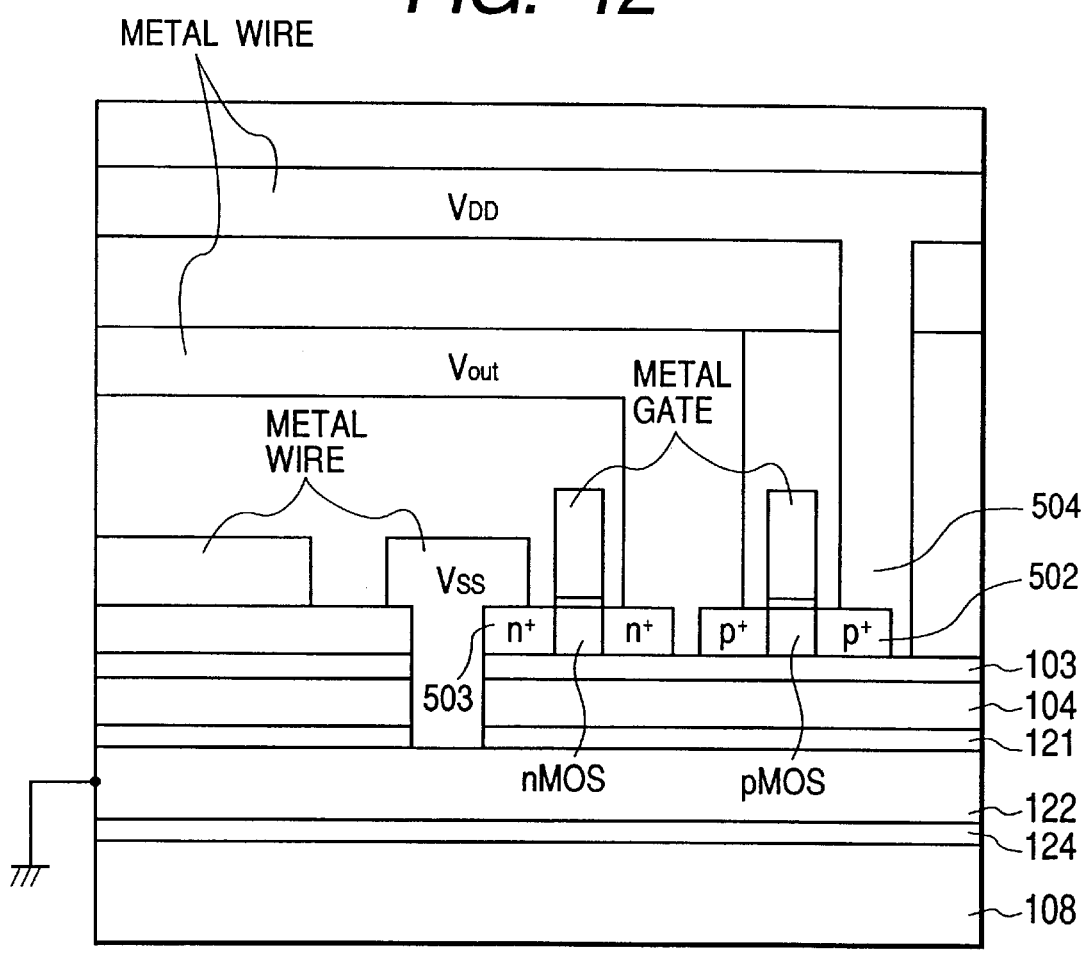
FIG. 12 is a schematic cross sectional view of another embodiment of CMOS device.

Then, MOS transistors were formed on the metal substrate SOI wafer as shown in FIG. 12. Firstly, an SiO$_2$ insulating film was formed and a 0.5 µm thick Ta layer was formed. Thereafter, the gate electrodes and the source/drain as a part of an active region of FET were patterned and the source/drain layer was formed by ion implantation. Note that, in this example, the Ta gate was used as mask in the process of forming the source/drain regions by ion implantation in a self aligning fashion. The layer implanted with ions was annealed at low temperature of 450° C. The ion implantation system used in this example was an ultra-clean ion implantation system designed to produce vacuum of a degree of $10^{-10}$ Torr and sufficiently minimize the contamination due to the sputtering of the metals of the chamber vessel caused by ion beams. A CMOS type inverter circuit was prepared and the source 503 of the n-type MOS transistor was connected to the Ir layer 122, via hole of the insulating layer located right thereunder while the source 502 of the p-type MOS transistor was connected to the Cu wire 504 located right thereon. The Ir layer and substrate are grounded and the Cu wire 504 was connected to the power supply voltage. The Cu wire 504 was made to have an area equal to ⅔ of that of the chip.

An n-type MOS and a p-type MOS having a structure shown in FIG. 12 except that the p$^+$-type Si layer 121 is omitted will exhibit a sub-threshold characteristic as shown in FIG. 8. On the other hand, the device prepared according to this example shows a sub-threshold characteristic as shown in FIG. 9. It will be appreciated that $\Delta V_{Th}$ is canceled by the existence of p$^+$-type Si layer in this arrangement. Thus, a CMOS inverter adapted to changes in $\Delta V_{Th}$ is realized by using an SOI wafer according to the invention.

The sheet resistance of the buried metal layer that was exposed by etching the wafer after the completion of the process is the same as shown in FIG. 10. For the purpose of comparison, FIG. 10 also shows the sheet resistance of a buried metal layer obtained by totally replacing the Ir by Ni. While sheet resistance of the specimen of this example did not show any change between immediately after the bonding operation and after the completion of the process (the line at the right side), that of the modified specimen showed a remarkable change (the line at the left side). By computation, it was found that about 48% of the Ni existed immediately after the bonding operation had been silicidized in the course of the various subsequent processing steps so that the thickness of the buried metal layer optimized relative to the skin depth had been changed to lose, if partly, the barrier effect against electromagnetic fields. Thus, it was proved that a metal substrate SOI device showing a wide process margin can be prepared according to the invention.

While silicon was used for the flat and plain semiconductor layer in the above example, any other semiconductor such as Ge, diamond or GaAs may be used to realize the same effect.

While Ir is used for the reaction terminating layer in the above example, it may be replaced by another high melting point metal (refractory metal) such as Ru, an alloy containing a high melting point metal, a semiconductor or a compound thereof to realize the same effect if the above processing steps are observed.

While a reaction between a metal such as nickel and silicon, that is a silicidation reaction, was used for bonding, other reactions including metal alloying reaction may be used to realize the some effect.

While nickel silicide was used as the silicide of the above example, silicide of some other metal may be used to realize the same effect.

While the Ni film formed on the surface of the device wafer was brought into close contact with the surface of the handle wafer and heated in the process of bonding the device wafer and the handle wafer in the above example, a silicon film formed on the surface of the device wafer may be brought into close contact with the surface metal layer of the handle wafer and heated in the bonding process to realize an effect same as that of the above example.

While the heat treatment was conducted in an Ar atmosphere after the bonding operation in the above example, the Ar gas may be replaced by an inert gas such as $N_2$ gas or He gas to realize the same effect.

Further, other conditions may be modified appropriately as in EXAMPLE 1.

It is preferable that an aluminum nitride layer instead of the silicon nitride layer is formed and that a metal layer is formed on the back surface of the handle wafer.

Thus, the present invention provides a method of preparing a high quality metal substrate SOI wafer that cannot be realized by the prior art by means of a cold process as well as a high quality metal substrate SOI wafer prepared by such a method. Additionally, the present invention makes it possible to realize a highly reliable SOI device that is adapted to be driven by a large electric current to transmit signals through the wires at high speed with an improved heat emitting ability. In short, a giga scale integration (GSI) can be realized for the first time by the present invention.

What is claimed is:

1. A bond SOI substrate comprising an electroconductive material layer formed on a support, an insulating layer formed on the electroconductive material layer and a single crystal semiconductor layer formed on the insulating layer, said electroconductive material layer formed at a bonded interface selected from:
   a reacted layer of metals;
   a reacted layer of a metal and a semiconductor;
   a reacted layer of a metal and a metal-semiconductor compound;
   a reacted layer of a semiconductor and a metal-semiconductor compound; and
   a reacted layer of a metal-semiconductor compounds,
   wherein a reaction suppressive layer consisting essentially of a material different from that of said electroconductive material layer is arranged between said electroconductive material layer and said insulating layer and/or between said electroconductive material layer and said support.

2. A bond SOI substrate according to claim 1, wherein at least the surface of said support is made of a semiconductor.

3. A bond SOI substrate according to claim 2, wherein said reacted layer is made of a silicide and the surface of said substrate is made of silicon.

4. A bond SOI substrate according to claim 1 or 2, wherein said reaction suppressive layer contains at least a layer of metal, semiconductor or a metal compound.

5. A bond SOI substrate according to claim 1 or 2, wherein said reaction suppressive layer is made of metal or a metal compound containing at least one of Ru, Ir, V, Ti, Cu, Be, Ag, Os, Mo and W.

6. A bond SOI substrate according to claim 1 or 2, wherein at least part of said reaction suppressive layer formed on the side of said insulating film is thicker than the skin depth of the electromagnetic wave corresponding to the highest frequency component required for a good signal transmission.

7. A bond SOI substrate according to claim 1 or 2, wherein said reaction suppressive layer is used as power supply line or ground line leading to a device.

8. A bond SOI substrate according to claim 1 or 2, wherein said reaction suppressive layer is made of an electroconductive material having a work function different from that of non-doped silicon.

9. A bond SOI substrate according to claim 1 or 2, wherein an electroconductive material layer having a work function different from that of non-doped silicon is arranged between said insulating layer and said reaction suppressive layer.

10. A bond SOI substrate according to claim 1 or 2, wherein said semiconductor is n-Si, $n^+$-Si, p-Si or $p^+$-Si.

11. A bond SOI substrate according to claim 1, wherein said reacted layer is made of a silicide and said reaction suppressive layer is made of metal.

12. A bond SOI substrate according to claim 1, wherein said insulating layer contains a silicon oxide film and silicon nitride or a silicon oxide film and aluminum nitride.

13. A bond SOI substrate according to claim 1, wherein said reaction suppressive layer is made of a material that does not react with the reacted layer at the temperature used for forming said reacted layer.

14. A method of preparing a semiconductor substrate as defined in claim 1, comprising steps of:
   forming an insulating layer on a first support made of a single crystal semiconductor;
   forming a first reaction precursory layer made of a metal, a semiconductor or a metal compound on said insulating layer;
   preparing a second support having a second reaction precursory layer made of a metal, a semiconductor or a metal compound; and
   bringing said first reaction precursory layer and said second reaction precursory layer into contact to react and bond them with each other, wherein said method further comprises a step of forming a reaction suppressive layer made of a material different from any of the materials of said first and second reaction precursory layers between said first reaction precursory layer and said insulating layer and/or between said second reaction precursory layer and said second support.

15. A method according to claim 14, wherein said reaction suppressive layer is made of at least one or more than one metals selected from Ru, Ir, Ag, Os, Tl, Cu, Bi, Pb, Sn, Mo, In and Zn.

16. A method according to claim 14, wherein said reaction suppressive layer is made of at least one or more than one metal compounds selected from TaN, TaSiN, TiN, TiSiN, WN and WSiN.

17. A method according to claim 14, wherein one of said first and second reaction precursory layers is made of silicon.

18. A method according to claim 14, wherein said first and second reaction precursory layers is respectively made of silicon and a first metal or vice versa and said reaction suppressive layer is made of a second metal that is less reactive than the first metal relative to silicon.

19. A method according to claim 18, wherein said first metal refers to at least one or more than one metals selected from Mg, Co, Ni, Pd, Pt and Ta and said second metal refers to at least one or more than one metals selected from Ru, Ir, Ag, Os, Tl, Cu, Bi, Pb, Sn, Mo, In and Zn.

20. A method of preparing a semiconductor substrate as defined in claim 1, comprising steps of:
    preparing a first substrate by
        forming an insulating layer on the surface of a silicon single crystal substrate body or a silicon single crystal thin film epitaxial layer;
        forming a first metal deposited film on the surface of said insulating layer; and
        forming a second metal deposited film on the surface of said first metal deposited film;
    preparing, on the other hand, a second substrate by
        forming a third metal deposited film on the surface of a silicon single crystal substrate body; and
        forming a fourth metal deposited film on the surface of said third metal deposited film; and
    subsequently holding said second metal deposited film on said first substrate and said fourth metal deposited film on said second substrate in close contact relative to each other and heat-treating them to cause an alloying reaction between said second metal deposited film and said fourth metal deposited film.

21. A method of preparing a semiconductor substrate as defined in claim 1, comprising steps of:
    preparing a first substrate by
        forming an insulating layer on the surface of a silicon single crystal substrate body or a silicon single crystal thin film epitaxial layer;
        forming a first metal deposited film on the surface of said insulating layer; and
        forming a second metal deposited film on the surface of said first metal deposited film;
    preparing, on the other hand, a second substrate by
        forming a third metal deposited film on the surface of a silicon single crystal substrate body; and
        forming a silicon deposited film on the surface of said third metal deposited film; and
    subsequently holding said second metal deposited film on said first substrate and said silicon deposited film on said second substrate in close contact relative to each other and heat-treating them to cause a silicidation reaction between said second metal deposited film and said silicon deposited film.

22. A method according to claim 20 or 21, wherein said first metal deposited film is made of a metal that does not form an alloy with the metal of said second metal deposited film.

23. A method of preparing a semiconductor substrate as defined in claim 1, comprising steps of:
    preparing a first substrate by
        forming an insulating layer on the surface of a silicon single crystal substrate body or a silicon single crystal thin film epitaxial layer;
        forming a first metal deposited film on the surface of said insulating layer; and
        forming a silicon deposited film on the surface of said first metal deposited film;
    preparing, on the other hand, a second substrate by
        forming a third metal deposited film on the surface of a silicon single crystal substrate body; and
        forming a fourth metal deposited film on the surface of said third metal deposited film; and
    subsequently holding said silicon deposited film on said first substrate and said fourth metal deposited film on said second substrate in close contact relative to each other and heat-treating them to cause a silicidation reaction between said silicon deposited film and said fourth metal deposited film.

24. A method of preparing a semiconductor substrate as defined in claim 1, comprising steps of:
    preparing a first substrate by
        forming an insulating layer on the surface of a silicon single crystal substrate body or a silicon single crystal thin film epitaxial layer;
        forming a first metal deposited film on the surface of said insulating layer; and
        forming a silicon deposited film on the surface of said first metal deposited film;
    preparing, on the other hand, a second substrate by
        forming a third metal deposited film on the surface of a silicon single crystal substrate body;
        forming a fourth metal deposited film on the surface of said third metal deposited film; and
        forming a silicon deposited film on the surface of said fourth metal deposited film; and
    subsequently holding the silicon deposited film on said first substrate and the silicon deposited film on said second substrate in close contact relative to each other and heat-treating them to cause said fourth metal deposited film to react with the silicon deposited film on said second substrate and then with the silicon deposited film on said first substrate for silicidation.

25. A method according to claim 23 or 24, wherein said first metal deposited film is made of a metal that does not form a silicide with silicon of the silicon deposited film.

26. A bond SOI substrate comprising an electroconductive material layer formed on a support, an insulating layer formed on the electroconductive material layer and a single crystal semiconductor layer formed on the insulating layer, said electroconductive material layer formed at a bonded interface and made of a metal or a metal compound,
    wherein a metal or a metal compound layer consisting essentially of a material different from that of said electroconductive material layer is arranged between said electroconductive material layer and said insulating layer and/or between said electroconductive material layer and said support.

27. A bond SOI substrate according to claim 26, wherein at least the surface of said support is made of a semiconductor.

28. A bond SOI substrate according to claim 26, wherein said insulating layer contains a silicon oxide film and silicon nitride or a silicon oxide film and aluminum nitride.

29. A bond SOI substrate according to claim 26, wherein said metal or metal compound layer is made of a silicide and the surface of said substrate is made of silicon.

30. A bond SOI substrate according to claim 26, wherein said metal or metal compound layer is made of a refractory metal, or a refractory metal compound.

31. A bond SOI substrate according to claim 26, wherein said metal or metal compound layer is made of metal or a metal compound containing at least one of Ru, Ir, V, Ti, Cu, Be, Ag, Os, Mo and W.

32. A bond SOI substrate according to claim 26, wherein at least part of said metal or metal compound layer formed on the side of said insulating film is thicker than the skin depth of the electromagnetic wave corresponding to the highest frequency component required for a good signal transmission.

33. A bond SOI substrate according to claim 26, wherein said metal or metal compound layer is used as power supply line or ground line leading to a device.

34. A bond SOI substrate according to claim 1 or 26, wherein a doped semiconductor layer is disposed beneath said insulating layer.

35. A bond SOI substrate according to claim 26, wherein another layer having a work function different from that of non-doped silicon is arranged between said insulating layer and said metal or metal compound layer.

36. A bond SOI substrate according to claim 1 or 26, wherein said support is n-Si, $n^+$-Si, p-Si or $p^+$-Si.

37. A bond SOI substrate according to claim 26, wherein said electroconductive material layer is made of a silicide and said metal or metal compound layer is made of refractory metal.

38. A bond SOI substrate according to claim 26, wherein said metal or metal compound layer is made of a material that does not react with said electroconductive material layer at the temperature used for forming said electroconductive material layer.

39. A method of preparing a semiconductor substrate as defined in claim 26, comprising steps of:
forming an insulating layer on a first support made of a single crystal semiconductor;
forming a first reaction precursory layer made of a metal, a semiconductor or a metal compound on said insulating layer;
preparing a second support having a second reaction precursory layer made of a metal, a semiconductor or a metal compound; and
bringing said first reaction precursory layer and said second reaction precursory layer into contact to react and bond them with each other, wherein said method further comprises a step of forming a reaction suppressive layer made of a material different from any of the materials of said first and second reaction precursory layers between said first reaction precursory layer and said insulating layer and/or between said second reaction precursory layer and said second support.

40. A bond SOI semiconductor substrate according to claim 26, wherein said metal or metal compound layer is made of at least one or more than one metals selected from Ru, Ir, Ag, Os, Tl, Cu, Bi, Pb, Sn, Mo, In, Zn, TaN, TaSiN, TiN, TiSiN, WN and WSiN.

41. A bond SOI substrate according to claim 26, wherein a metal layer is disposed on a back surface of said support.

42. A bond SOI substrate according to claim 26, wherein said semiconductor layer comprises an active region of a FET or a bipolar transistor, a part of said active region being connected with said electroconductive material layer or said metal or metal compound layer through a hole of said insulating layer.

43. An SOI device comprising an electroconductive material layer formed on a support, an insulating layer formed on the electroconductive material layer and a single crystal semiconductor layer formed on the insulating layer, said electroconductive material layer being formed at a bonded interface and made of a metal or a metal compound,
wherein a metal or a metal compound layer consisting essentially of a material different from that of said electroconductive material layer is arranged between said electroconductive material layer and said insulating layer and/or between said electroconductive material layer and said support.

44. An SOI device according to claim 43, wherein at least the surface of said support is made of a semiconductor.

45. An SOI device according to claim 43, wherein said insulating layer contains a silicon oxide film and silicon nitride or a silicon oxide film and aluminum nitride.

46. An SOI device according to claim 43, wherein said metal or metal compound layer is made of a silicide and the surface of said substrate is made of silicon.

47. An SOI device according to claim 43, wherein said metal or metal compound layer is made of a refractory metal, or a refractory metal compound.

48. An SOI device according to claim 43, wherein said metal or metal compound layer is made of metal or a metal compound containing at least one of Ru, Ir, V, Ti, Cu, Be, Ag, Os, Mo and W.

49. An SOI device according to claim 43, wherein at least part of said metal or metal compound layer formed on the side of said insulating film is thicker than the skin depth of the electromagnetic wave corresponding to the highest frequency component required for good signal transmission.

50. An SOI device according to claim 43, wherein said metal or metal compound layer is used as a power supply line or ground line leading to another device.

51. An SOI device according to claim 43, wherein a doped semiconductor layer is disposed beneath said insulating layer.

52. An SOI device according to claim 43, wherein another layer having a work function different from that of non-doped silicon is arranged between said insulating layer and said metal or metal compound layer.

53. An SOI device according to claim 43, wherein said support is n-Si, $n^+$-Si, p-Si, or $p^+$-Si.

54. An SOI device according to claim 43, wherein said electroconductive material layer is made of a silicide and said metal or metal compound layer is made of refractory metal.

55. An SOI device according to claim 43, wherein said metal or metal compound layer is made of a material that does not react with said electroconductive material layer at the temperature used for forming said electroconductive material layer.

56. An SOI device according to claim 43, wherein said metal or metal compound layer is made of at least one or more than one metals selected from Ru, Ir, Ag, Os, Tl, Cu, Bi, Pb, Sn, Mo, In, Zn, TaN, TaSiN, TiN, TiSiN, WN and WSiN.

57. An SOI device according to claim 43, wherein a metal layer is disposed on a back surface of said support.

58. An SOI device according to claim 43, wherein said semiconductor layer comprises an active region of an FET or a bipolar transistor, a part of said active region being connected with said electroconductive material layer or said metal or metal compound layer through a hole of said insulating layer.

* * * * *

UNITED STATES PATENT AND TRADEMARK OFFICE
CERTIFICATE OF CORRECTION

PATENT NO.   : 6,255,731 B1                                      Page 1 of 1
DATED        : July 3, 2001
INVENTOR(S)  : Tadahiro Ohmi et al.

It is certified that error appears in the above-identified patent and that said Letters Patent is hereby corrected as shown below:

<u>Title page,</u>
Item [73], Assignees, "Tadahiro Ohmi" should be deleted.

<u>Column 2,</u>
Line 3, "an" should read -- a --.

<u>Column 6,</u>
Line 37, "NMOS." should read -- nMOS. --.

<u>Column 8,</u>
Line 14, "metals" should read -- metal --;
Lines 16 and 28, "alloys" should read -- alloy --; and
Line 31, "suicides." should read -- silicides. --.

<u>Column 16,</u>
Line 52, "$10^{10}$" should read -- $10^{-10}$ --.

<u>Column 19,</u>
Line 33, "some" should read -- same --.

Signed and Sealed this

Seventeenth Day of June, 2003

JAMES E. ROGAN
*Director of the United States Patent and Trademark Office*